(12) United States Patent
Galton et al.

(10) Patent No.: US 10,158,366 B2
(45) Date of Patent: Dec. 18, 2018

(54) DIGITAL FRACTIONAL-N PLL BASED UPON RING OSCILLATOR DELTA-SIGMA FREQUENCY CONVERSION

(71) Applicant: The Regents of the University of California, Oakland, CA (US)

(72) Inventors: Ian Galton, Del Mar, CA (US); Colin Weltin-Wu, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/052,578

(22) Filed: Feb. 24, 2016

(65) Prior Publication Data
US 2017/0244544 A1    Aug. 24, 2017

(51) Int. Cl.
| | | |
|---|---|---|
| *H04L 7/033* | (2006.01) | |
| *H04L 7/00* | (2006.01) | |
| *H03L 7/093* | (2006.01) | |
| *H03L 7/099* | (2006.01) | |
| *H03L 7/089* | (2006.01) | |
| *H03L 7/091* | (2006.01) | |
| *H03L 7/085* | (2006.01) | |
| *H03L 7/183* | (2006.01) | |

(52) U.S. Cl.
CPC ............ *H03L 7/0998* (2013.01); *H03L 7/085* (2013.01); *H03L 7/093* (2013.01); *H03L 7/099* (2013.01); *H03L 7/183* (2013.01); *H03L 2207/50* (2013.01)

(58) Field of Classification Search
CPC ......... H03L 7/085; H03L 7/093; H03L 7/099; H03L 7/183; H03L 2207/50; H03L 7/146; H03L 7/07; H03L 7/18
See application file for complete search history.

(56) References Cited

U.S. PATENT DOCUMENTS

| | | | | |
|---|---|---|---|---|
| 7,888,973 B1* | 2/2011 | Rezzi | ...................... | H03L 7/085 327/105 |
| 2010/0141314 A1* | 6/2010 | Chen | ......................... | H03L 7/07 327/159 |
| 2011/0133799 A1* | 6/2011 | Dunworth | ............... | H03L 7/089 327/157 |
| 2012/0194369 A1* | 8/2012 | Galton | .................. | H03M 3/388 341/120 |

(Continued)

OTHER PUBLICATIONS

Amr Elshazly, SachinRao, Brian Young, Member and Pavan Kumar Hanumolu, "A Noise-Shaping Time-to-Digital Converter Using Switched-Ring Oscillators-Analysis, Design, and Measurement Techniques", Oregon State University, Qualcomm, Marvell Semiconductor, University of Illinois, IEEE Journal of Solid-State Circuits, vol. 49, No. 5, May 2014.*

(Continued)

*Primary Examiner* — Aristocratis Fotakis
(74) *Attorney, Agent, or Firm* — Greer, Burns & Crain, Ltd.; Steven P. Fallon

(57) ABSTRACT

A frequency-to-digital-converter based PLL (FDC-PLL) that implements the functionality of a charge pump and analog-to-digital converter (ADC) with a dual-mode ring oscillator (DMRO) and digital logic. Preferred embodiments of the invention include circuit-level techniques that provide better spurious tone performance and very low phase noise with lower power dissipation and supply voltage than prior digital PLLs known to the inventors.

14 Claims, 19 Drawing Sheets

(56) References Cited

U.S. PATENT DOCUMENTS

| | | | | |
|---|---|---|---|---|
| 2014/0368366 | A1* | 12/2014 | Galton | H03M 3/386 341/143 |
| 2015/0145567 | A1* | 5/2015 | Perrott | H03L 7/093 327/156 |
| 2016/0065224 | A1* | 3/2016 | Galton | H03L 7/093 327/157 |
| 2016/0233870 | A1* | 8/2016 | Van Engelen | H03L 7/099 |
| 2017/0214408 | A1* | 7/2017 | Liang | H03L 7/099 |

OTHER PUBLICATIONS

Chun-Ming Hsu, Matthew Z. Straayer, and Michael H. Perrott, A Low-Noise Wide-BW 3.6-GHz Digital delta sigma Fractional-N Frequency Synthesizer With a Noise-Shaping Time-to-Digital Converter and Quantization Noise Cancellation, IEEE Journal of Solid-State Circuits, vol. 43, No. 12, Dec. 2008.*
Christian Venerus and Ian Galton, Delta-Sigma FDC Based Fractional-PLLs, Univeristy of California at San Diego, IEEE, 2012.*
M. Talegaonkar, T. Anand, A. Elkholy, A. Elshazly, R. K. Nandwana, S. Saxena, B. Young, W. Choi, P. K. Hanumolu, A 4.4-5.4GHz Digital Fractional-N PLL Using $\Delta\Sigma$ Frequency-to-Digital Converter, 2014 Symposium on VLSI Circuits Digest of Technical Papers.*
Zule Xu, Seungjong Lee, Masaya Miyahara, and Akira Matsuzawa, a 0.84ps-LSB 2.47mW Time-to-Digital Converter Using Charge Pump and SAR-ADC, Tokyo Institute of Technology, 2013, IEEE.*
Colin Weltin-Wu, Guobi Zhao, Ian Galton, "A Highly-Digital Frequency Synthesizer Using Ring-Oscillator Frequency-to-Digital Conversion and Noise Cancellation", Analog Devices, University of California, Feb. 25, 2015.*
Colin Weltin-Wu, Guobi Zhao, Ian Galton, "A 3.5 GHz Digital Fractional-N PLL Frequency Synthesizer Based on Ring Oscillator Frequency-to-Digital Conversion", Analog Devices, Spreadtrum, University of California, Nov. 24, 2015.*
Colin Weltin-Wu, Eythan Familier, Ian Galton, "A Linearized Model for the Design of Fractional-Digital PLLs Based on Dual-Mode Ring Oscillator FDCs", University of California, Aug. 2015.*
Christian Venerus and Ian Galton, "A TDC-Free Mostly-Digital FDC-PLL Frequency Synthesizer With a 2.8-3.5 GHz DCO", Qualcomm Technologies and University of California, IEEE, Nov. 10, 2014.*
Bax, W.T., et al., "A GMSK Modulator Using a $\Delta\Sigma$ Frequency Discriminator-Based Synthesizer", IEEE Journal of Solid-State Circuits, vol. 36, No. 8, (Aug. 2001), pp. 1218-1227.
Borremans, J., et al., "A 86MHz-to-12GHz Digital-Intensive Phase-Modulated PLL for Software-Defined Radi19os, Using a 6fJ/Step TDC in 40nm digital CMOS", IEEE Journal of Solid-State Circuits, vol. 45, No. 10, (Oct. 2010), pp. 2116-2129.
Chang, H. H., et al, "A Fractional Spur-Free ADPLL with Loop-Gain Calibration and Phase-Noise Cancellation for GSM/GPRS/EDGE", IEEE International Solid-State Circuits Conference, vol. 606, (Feb. 2008), pp. 200-201.
Chen, M.S., et al., "A Calibration-Free 800 MHz Fractional-N Digital PLL With Embedded TDC", IEEE Journal of Solid-State Circuits, vol. 45, No. 12, (Dec. 2010), pp. 2819-2827.
Chen, J., et al., "The design of all-digital polar transmitter based on ADPLL and phase synchronized $\Delta\Sigma$ modulator", IEEE Journal of Solid-State Circuits, vol. 47, No. 5, (May 2012), pp. 1154-1164.
De Muer, B., et al., "A CMOS monolithic $\Delta\Sigma$-controlled fractional-N frequency synthesizer for DCS-1800", IEEE Journal of Solid-State Circuits, vol. 37, No. 7, (Jul. 2002), pp. 835-844.
Galton, Ian, "Granular Quantization Noise in a Class of Delta-Sigma Modulators", IEEE Transactions on Information Theory, vol. 40, No. 3, (May 1994), pp. 848-859.
Hedayati, H., et al., "A 1 MHz Bandwidth, 6 GHz 0.18 μm CMOS Type-I $\Delta\Sigma$ Fractional-N Synthesizer for WiMAX Applications", IEEE Journal of Solid-State Circuits, vol. 44, No. 12, (Dec. 2009), pp. 3244-3252.

Jee, D.-W., "A 2GHz fractional-N digital PLL with 1b noise shaping TDC", IEEE Journal of Solid-State Circuits, vol. 47, No. 4, (Apr. 2012), pp. 875-883.
Kratyuk, V., et al., "A Digital PLL With a Stochastic Time-to-Digital Converter," IEEE Transactions on Circuits and Systems I: Regular Papers, vol. 56, No. 8, (Aug. 2009), pp. 1612-1621.
Lee, M., et al., "A low-noise wideband digital phase-locked loop based on a coarse-fine time-to-digital converter with subpicosecond resolution", IEEE Journal of Solid-State Circuits, vol. 44, No. 10, (Oct. 2009), pp. 2808-2816.
Levantino, S., et al., "An Adaptive Pre-Distortion Technique to Mitigate the DTC Nonlinearity in Digital PLLs", IEEE Journal of Solid-State Circuits, to appear, vol. 49, No. 8, (Aug. 2014), pp. 1762-1772.
Li, L., et al., "A 5.8GHz Digital Arbitrary Phase-setting Type II PLL in 65nm CMOS with 2.25o Resolution", IEEE Asian Solid-State Circuits Conference, (Nov. 2012), pp. 317-320.
Marzin, G., "A 20Mb/s Phase Modulator Based on a 3.6GHz Digital PLL with -36dB EVM at 5mW Power", IEEE International Solid-State Circuits Conference, vol. 47, No. 12, (Dec. 2012), pp. 342-343.
Miller, B., et al., "A multiple modulator fractional divider", Annual IEEE Symposium on Frequency Control, vol. 44, (Mar. 1990), pp. 559-568.
Park, C., et al., "A 1.8-GHz self-calibrated phase-locked loop with precise I/Q matching", IEEE Journal of Solid-State circuits, vol. 36, No. 5, (May 2001), pp. 777-783.
Shen, B., et al., "An 8.5 mW, 0.07 mm² ADPLL in 28 nm CMOS with Sub-ps Resolution TDC and < 230 fs RMS Jitter", Symposium on VLSI Circuits, (Jun. 2013), pp. C192-C193.
Staszewski, R.B., et al., "All-Digital PLL and GSM/EDGE Transmitter in 90nm CMOS", IEEE International Solid-State Circuits Conference, (Feb. 2005), pp. 316-317.
Takinami, K, et al., "A rotary-traveling-wave-oscillator-based all-digital PLL with a 32-phase embedded phase-todigital converter in 65nm CMOS", IEEE International Solid-State Circuits Conference, (Feb. 2011), pp. 100-102.
Tasca, D., et al., "A 2.94-to-4.0 GHz fractional-N digital PLL with bang-bang phase detector and 560 fs rms integrated jitter at 4.5 mW power", IEEE Journal of Solid-State Circuits, vol. 46, No. 12, (Dec. 2011), pp. 2745-2758.
Temporiti, E., et al., "A 700 kHz Bandwidth $\Delta\Sigma$ Fractional Synthesizer with Spurs Compensation and Linearization Techniques for WCDMA Applications", IEEE Journal of Solid-State Circuits, vol. 39, No. 9, (Sep. 2004), pp. 1446-1454.
Temporiti, E., et al., "A 3.5 GHz Wideband ADPLL With Fractional Spur Suppression Through TDC Dithering and Feedforward Compensation", IEEE Journal of Solid-State Circuits, vol. 45, No. 12, (Dec. 2010), pp. 2723-2736.
Tokairin, T., et al., "A 2.1-to-2.8-GHz low-phase-noise all-digital frequency synthesizer with a time-windowed time-to-digital converter," IEEE Journal of Solid-State Circuits, vol. 45, No. 12, (Dec. 2010), pp. 2582-2590.
Tonietto, R., et al., "A 3 MHz Bandwidth Low Noise RF All Digital PLL with 12ps Resolution Time-to-Digital Converter," European Solid-State Circuits Conference, (Sep. 2006), pp. 150-153.
Ueda, K., et al., "A Digital PLL with Two-step Closed-locking for Multi-mode/Multi-band SAW-less Transmitter", IEEE Custom Integrated Circuits Conference, (Sep. 2012), pp. 1-4.
Vaucher, C.S., et al., "A family of low-power truly modular programmable dividers in standard 0.35-um CMOS technology", IEEE Journal of Solid-State Circuits, vol. 35, No. 7, (Jul. 2000), pp. 1039-1045.
Venerus, C., et al., "Delta-Sigma FDC Based Fractional-N PLLs", IEEE Transactions on Circuits and Systems I: Regular Papers, vol. 60, No. 5, (May 2013), pp. 1274-1285.
Vercesi, L., et al., "A Dither-Less All Digital PLL for Cellular Transmitters", IEEE Journal of Solid-State Circuits, vol. 47, No. 8, (Aug. 2012), pp. 1908-1920.
Waheed, K., et al., "Spurious free time-to-digital conversion in an ADPLL using short dithering sequences", IEEE Custom Integrated Circuits Conference, (Sep. 2010), pp. 1-4.

(56) References Cited

OTHER PUBLICATIONS

Weltin-Wu, C., et al., "A 3 GHz Fractional-N All-Digital PLL with Precise Time-to-Digital Converter Calibration and Mismatch Correction", IEEE International Solid-State Circuits Conference, (Feb. 2008), pp. 344-345.

Yao, C.-W., et al., "A 2.8-3.2-GHz fractional-N digital PLL with ADC-assisted TDC and inductively coupled fine-tuning DCO", IEEE Journal of Solid-State Circuits, vol. 48, No. 3, (Mar. 2013), pp. 698-710.

Zanuso, M., et al., "A 3MHz-BW 3.6GHz Digital Fractional-N PLL with Sub-Gate-Delay TDC, Phase-Interpolation Divider, and Digital Mismatch Cancellation", IEEE International Solid-State Circuits Conference, (Feb. 2010), pp. 476-477.

Zhang, B., et al., "A fast switching PLL frequency synthesizer with an on-chip passive discrete-time loop filter in 0.25-µm CMOS", IEEE Journal of Solid-State Circuits, vol. 38, No. 6, (Jun. 2003), pp. 855-865.

Ian Galton, "Delta-Sigma Fractional-N Phase-Locked Loops", RF microelectronics, Razavi, B. (Editor), Prentice Hall, 1998.

Schreier, R., et al., "Understanding Delta-Sigma Data Converters", John Wiley and Sons, (2005).

\* cited by examiner

| | A | B | C | D | E | F | Invention |
|---|---|---|---|---|---|---|---|
| Technology | 90 nm | 130 nm | 65 nm | 65 nm | 65 nm | 130 nm | 65 nm |
| Supply (V) | 1.2 | Not Stated | 1.2 | 1.5/1.2 | 1.5 | 1.5 | 1.0 |
| Power Consumption[1] (mW) | Not Stated | >40[4] | 8.7 | 45 | 41.6 | 39 | 15.6 |
| Area (mm$^2$) | Not Stated | 0.86 | 0.44 | 0.6 | 0.7 | 0.95 | 0.35 |
| Reference Frequency (MHz) | 26 | 26 | 35 | 78 | 26 | 50 | 26 |
| PLL Frequency (GHz) | 3.6 | 3.6 | 3.5 | 4.0 | 1.8 | 3.7 | 3.5 |
| Bandwidth (kHz) | 40 | 50 | 3400 | 1000 | 800 | 500 | 140 |
| In-band Phase Noise[2] (dBc/Hz) | -81@20kHz | -79@10kHz | -101@1MHz | -109@200kHz | -102@60kHz | -107@400kHz | -93@100kHz |
| Out-of-band Phase Noise[2] (dBc/Hz) | -117@1MHz[3] -152@20MHz | -126@1MHz -136@3MHz -152@20MHz | - -129@20MHz | - -149@20MHz | -122@3MHz -154@20MHz | -131@3MHz -149@20MHz | -126@1MHz -138@3MHz -151@20MHz |
| In-band Fractional Spur (dBc) | Not Stated | Not Stated | -58 | -40 | -50 | -42 | -60 |
| Reference Spur (dBc) | -92 | -84 | -61 | -56 | Not Stated | -65 | -81 |

FIG. 18

DIGITAL FRACTIONAL-N PLL BASED UPON RING OSCILLATOR DELTA-SIGMA FREQUENCY CONVERSION

STATEMENT OF GOVERNMENT INTEREST

This invention was made with government support under Grant No. 1343389 awarded by the National Science Foundation. The Government has certain rights in the invention.

FIELD

A field of the invention is frequency synthesis. Example applications of the invention are in wired and wireless communications. A particular application of the invention is in wireless transceivers for the generation of radio frequency (RF) local oscillator signals used to up-convert and down-convert transmitted and received RF signals.

BACKGROUND

Evolving wireless communication standards place increasingly stringent performance requirements on the frequency synthesizers that generate RF local oscillator signals for up and down conversion in wireless transceivers. Conventional analog fractional-N PLLs with digital delta-sigma (Δs) modulation are the current standard for such frequency synthesizers because of their excellent noise and spurious tone performance. See, e.g., T. A. Riley, M. A. Copeland, T. A. Kwasniewski, "Delta-sigma modulation in fractional-N frequency synthesis," *IEEE Journal of Solid-State Circuits*, vol. 28, no. 5, pp. 553-559, May 1993. Unfortunately, they require high-performance analog charge pumps and large-area analog filters, so the trends of CMOS technology scaling and increasingly dense system-on-chip integration have created an inhospitable environment for them.

Digital fractional-N PLLs have been developed over the last decade to address this problem. See, e.g., C. Hsu, M. Z. Straayer, M. H. Perrott, "A Low-Noise, Wide-BW 3.6 GHz Digital ΔΣ Fractional-N Frequency Synthesizer with a Noise-Shaping Time-to-Digital Converter and Quantization Noise Cancellation," *IEEE International Solid-State Circuits Conference*, pp. 340-341, February 2008. They avoid large analog loop filters and can tolerate device leakage and low supply voltages which makes them better-suited to highly-scaled CMOS technology than analog PLLs. They are increasingly used in place of analog PLLs as frequency synthesizers, but they have yet to fully replace analog PLLs in high-performance wireless applications. While both analog and digital fractional-N PLLs introduce quantization noise, in prior digital PLLs the quantization noise has higher power or higher spurious tones than in comparable analog PLLs. Consequently, they exhibit worse phase noise or spurious tone performance than the best analog PLLs. See, e.g., K. Wang, A. Swaminathan, I Galton, "Spurious-Tone Suppression Techniques Applied to a Wide-Bandwidth 2.4 GHz Fractional-N PLL," *IEEE Journal of Solid-State Circuits*, vol. 43, no. 12, pp. 2787-2797, December 2008. Digital PLLs based on second-order ΔΣ frequency-to-digital conversion (FDC-PLLs) offer a potential solution to this problem in that their quantization noise ideally is equivalent to that of an analog PLL with second-order ΔΣ modulation. To the knowledge of the inventors, prior second-order FDC-PLLs incorporate charge pumps and ADCs. See, e.g., W. T. Bax, M. A. Copeland, "A GMSK Modulator Using a ΔΣ Frequency Discriminator-Based Synthesizer," *IEEE Journal of Solid-State Circuits*, vol. 36, no. 8, pp. 1218-1227, August 2001; C. Venerus, I. Galton, "Delta-Sigma FDC Based Fractional-N PLLs," *IEEE Transactions on Circuits and Systems I: Regular Papers*, vol. 60, no. 5, pp. 1274-1285, May 2013. The inventors have identified the charge pumps and ADCs in such prior second-order frequency-to-digital phase locked loops (FDC-PLLs) as placing limitations on performance and minimum supply voltage.

SUMMARY OF THE INVENTION

Preferred embodiments provide a frequency-to-digital-converter based PLL (FDC-PLL) that implements the functionality of a charge pump and analog-to-digital converter (ADC) with a dual-mode ring oscillator (DMRO) and digital logic. Preferred embodiments of the invention include circuit-level techniques that provide better spurious tone performance and very low phase noise with lower power dissipation and supply voltage than prior digital PLLs known to the inventors.

DETAILED DESCRIPTION OF THE PREFERRED EMBODIMENTS

Figure 1:
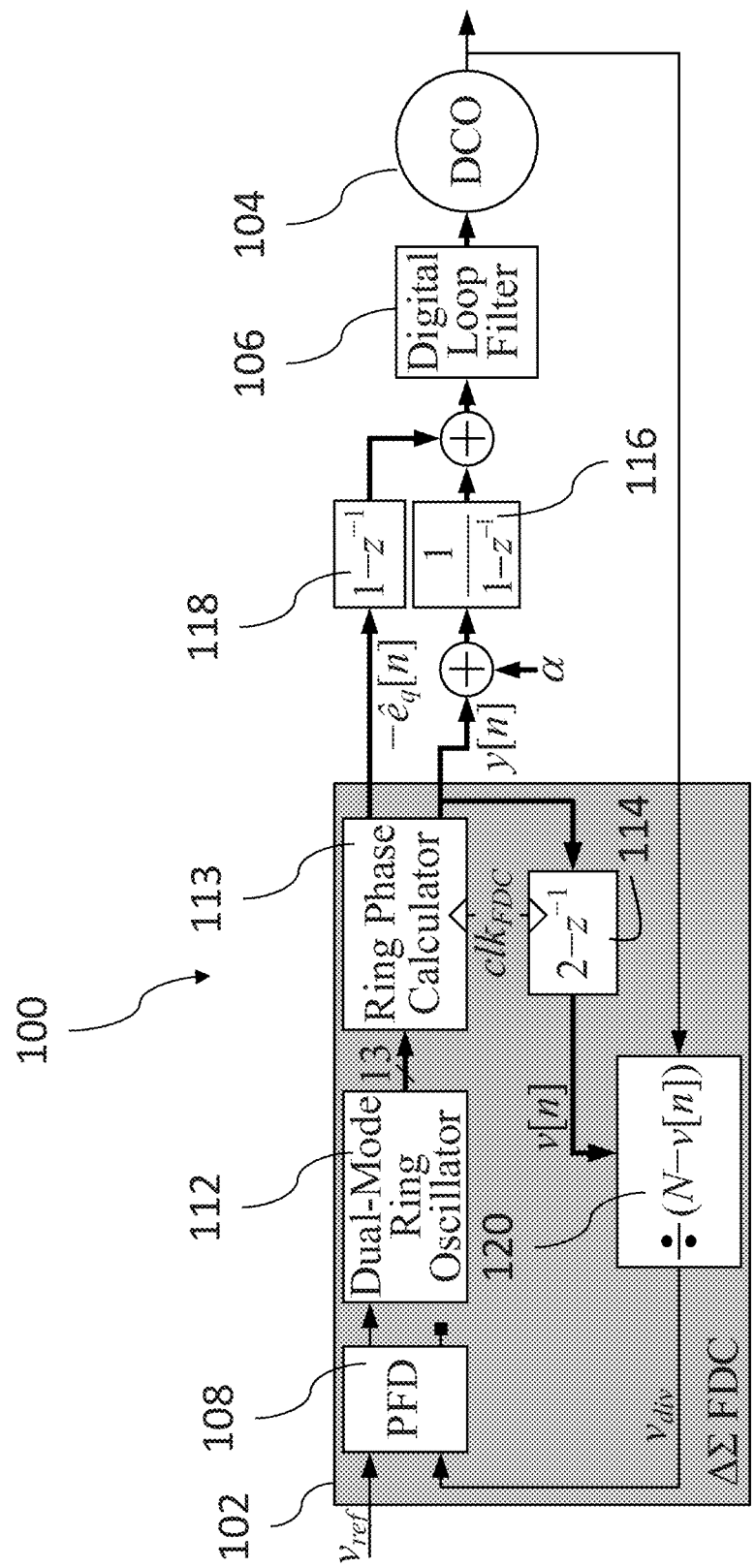
FIG. 1 is a block diagram of a preferred embodiment frequency-to-digital phase locked loop (FDC-PLL) of the invention.

Preferred embodiment fractional-N phase-locked loop frequency synthesizers based on second-order delta-sigma (ΔΣ) frequency-to-digital converters (FDCs), referred to as second-order FDC-PLLs, offer advantages of both analog and digital PLL frequency synthesizers in that they have the same quantization noise behavior as analog PLLs based on second-order ΔΣ modulators, so like such analog PLLs they can achieve very good spurious tone performance. Yet their loop filters are entirely digital so they are very compact like digital PLLs.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1 shows a preferred embodiment second-order FDC-PLL 100. The input, $v_{ref}(t)$, to the FDC-PLL 100 is a periodic reference signal of frequency $f_{ref}$, and the output, $v_{out}(t)$, from the FDC-PLL ideally is periodic with frequency $(N+\alpha)f_{ref}$, where N is a positive integer and a is a fractional value in the range −½ to ½. The input, $v_{ref}(t)$, is received by a ΔΣ frequency-to-digital converter (ΔΣ FDC) 102 and the output is generated from a digitally controlled oscillator (DCO) 104 that is driven by a lowpass digital loop filter (DLF) 106. The ΔΣ FDC 102 is significantly different from the prior FDC-PLLs that rely upon charge pumps and ADCs.

The ΔΣ FDC includes a phase-frequency detector (PFD) 108 and multi-modulus divider 110 of the types used in analog PLLs. The PFD generates digital output pulses that goes high when the reference voltage, $v_{ref}(t)$, goes high and go low when the divider output voltage, $v_{div}(t)$, goes high. A dual-mode ring oscillator (DMRO) 112 with K (e.g., 13) delay elements is driven by the PFD 108 and its phase is calculated by a digital ring phase calculator 113. A $2-z^{-1}$ digital filter function 114 provides a local feedback path through a divider 120. The DMRO 112 frequency switches from $f_{low}$ to $f_{high}$ when the PFD output, u(t), goes high, and from $f_{high}$ to $f_{low}$ when u(t) goes low, where, in this particular preferred embodiment, $f_{high} - f_{low} \cong f_{PLL}$.

The y[n] output of the ΔΣ FDC is an integer-valued, $f_{ref}$-rate digital sequence. It can be written as $y[n] = -\alpha - e_{PLL}[n] + e_{\Delta\Sigma}[n]$, where $e_{PLL}[n]$ is an estimate of the PLL's 100 average frequency error over the nth reference period, and $e_{\Delta\Sigma}[n]$ is quantization noise. $e_{\Delta\Sigma}[n]$ can be proven to be identical to the quantization noise from a second-order ΔΣ modulator (See, FIGS. 5A and 5B). This implies that $e_{\Delta\Sigma}[n] = e_q[n] - 2e_q[n-1] + e_q[n-2]$, where $e_q[n]$ is uniform quantization noise. A digital value, α, is added to y[n] and the result is accumulated to generate an estimate of the PLL's phase error plus first-order quantization noise given by $e_q[n] - e_q[n-1]$. Therefore, each output sample of an accumulator 116 prior to the DLF 106 is nearly proportional to the amount of charge in each charge pump pulse in an analog PLL with second-order ΔΣ modulation.

The $-\hat{e}_q[n]$ output of the ΔΣ FDC 102 is a digitized version of $-e_q[n]$ with a quantization step-size of 1/26, so it can be written as $-\hat{e}_q[n] = -e_q[n] + e_{Rq}[n]$, where $e_{Rq}[n]$ is quantization noise with much (about 28 dB) lower power than $e_q[n]$. Its first difference 118 is added to the output of the accumulator 116 prior to the DLF 106. This has the effect of cancelling most of the quantization noise prior to the DLF, because it replaces $e_q[n] - e_q[n-1]$ with $e_{Rq}[n] - e_{Rq}[n-1]$. Therefore, preferred specific circuits in accordance with the invention are designed such that $\hat{e}_q[n]$ is approximately equal to $e_q[n]$, so the $-\hat{e}_q[n]$ path in the FDC-PLL 100 approximately cancels $e_q[n] - e_q[n-1]$ prior to the DLF 106. This allows the PLL bandwidth to be increased without significantly increasing the contribution of quantization noise to the PLL's phase noise.

The DLF 106 contains a proportional-integral filter which sets the in-band poles and zeros that control the FDC-PLL's dynamics, and it also contains IIR filter stages that introduce four out-of-band poles to further suppress the residual ΔΣ quantization noise. In preferred embodiments, a linearized model is used to choose the placement of the poles and zeroes. A model is provided in Weltin-Wu, C. et al, "A Linearized Model for the Design of Fractional—N Digital PLLs Based on Dual-Mode Ring Oscillator FDCs," IEEE Transactions on Circuits and Systems, Vol. 62, Issue 8, pages 2013-23 (2015), which is incorporated by reference herein.

Figure 2:
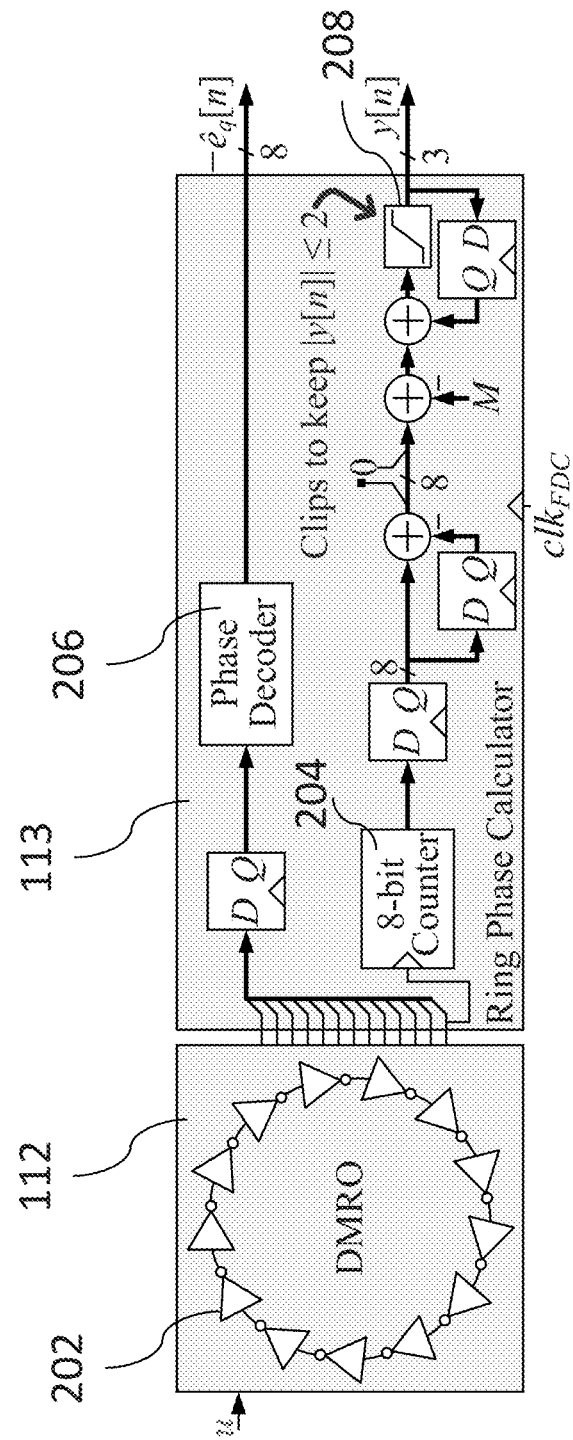
FIG. 2 is block diagram that illustrates signal processing of the ring phase calculator of FIG. 1.

As shown in FIG. 2, the ring phase calculator 113 samples outputs of inverters 202 in the DMRO 112 to generate $-\hat{e}_q[n]$ and samples the output of an C-bit counter (C=8 in the example) 204 clocked by one of the DMRO's inverters to generate y[n]. These sampling operations are synchronous with each rising edge of the $f_{ref}$-rate clock, $clk_{FDC}$, which is asynchronous with the rising edges of the DMRO inverter outputs. Synchronization circuitry is discussed below that enables the sampling to occur without errors and metastability issues. The synchronization circuitry is omitted from FIG. 2 to simplify the ring phase calculator's signal processing explanation.

Figures 3A, 3B:
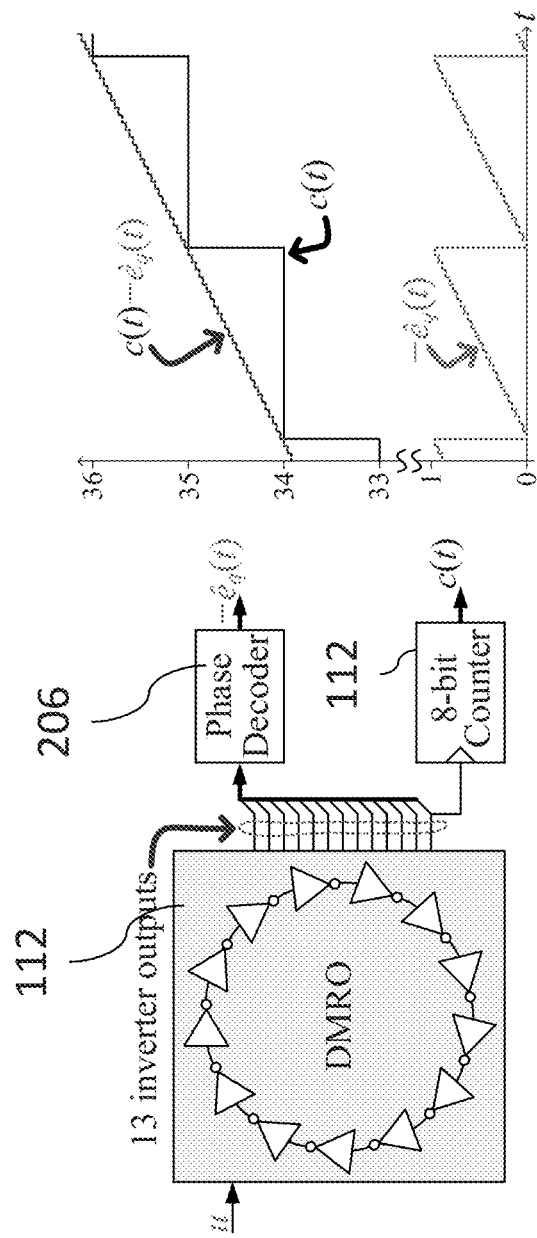
FIGS. 3A and 3B illustrate the relationship between the FIG. 1 ring phase calculator's phase decoder and 8-bit counter.

The ring phase calculator's 8-bit counter 204 is never reset, so it counts DMRO cycles and rolls over every 256 DMRO cycles. Thus, its output can be viewed as the measured DMRO phase in cycles quantized down to the nearest integer modulo 256. The example DMRO 112 includes 13 inverters 202. A phase decoder 206 uses all 13 DMRO inverter outputs to measure the counter's quantization error to a resolution of 1/26 of a DMRO cycle, so its output can be viewed as a quantized version of the counter's quantization error. This is illustrated in FIGS. 3A and 3B, in which the sampling operation prior to the phase decoder is omitted for illustration clarity. A clipper 208 shown in FIG. 2 only affects the locking behavior of the PLL because the magnitude of y[n] would be bounded by 2 when the PLL is locked even without the clipper. The purpose of the clipper 208 is to reduce the PLL's worst-case locking time.

Figure 4:
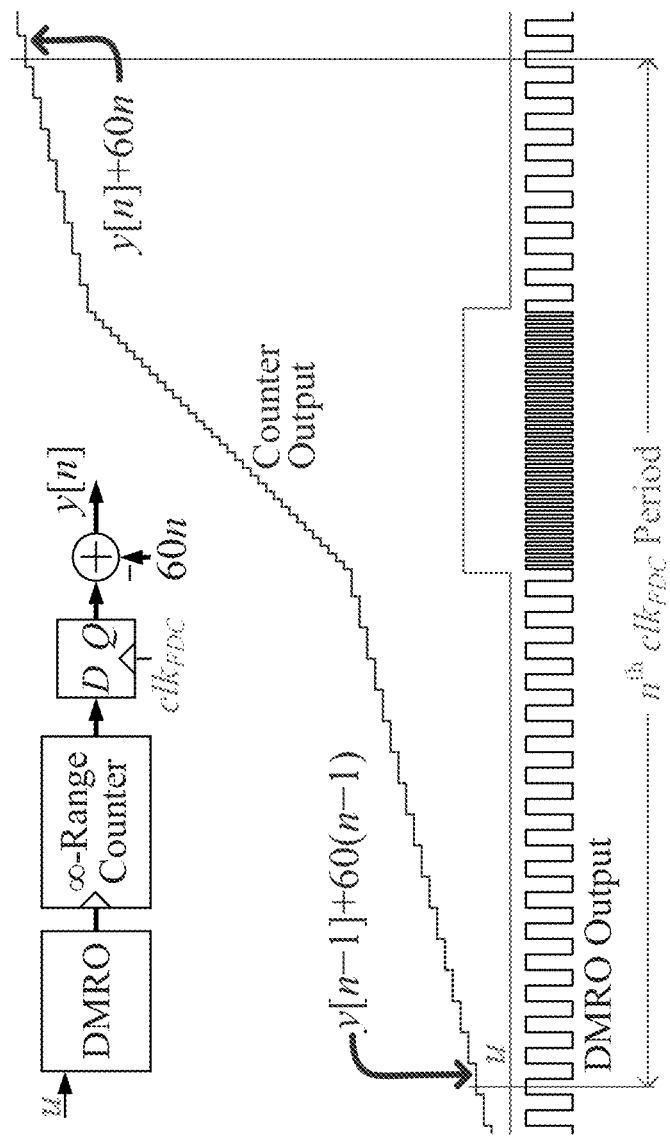
FIG. 4 illustrates equivalent behavior of the FIG. 1 ring phase calculator in terms of how it generates y[n]

During the nth $clk_{FDC}$ period, the ring phase calculator 113 subtracts the previous from the current sampled counter output and clears the most significant bit (MSB) of the result. Frequency is the derivative of phase, so it can be verified that these operations result in a measure of the DMRO frequency divided by $f_{ref}$ and quantized to the nearest integer. The ring phase calculator 113 subtracts an integer, M, from this frequency measure and accumulates the result to generate y[n]. In an example prototype IC that has been fabricated, M can be set to any integer from 40 to 80). It can be verified that y[n] is the difference between the DMRO's phase in cycles quantized down to the nearest integer and the phase of an ideal oscillator of frequency $Mf_{ref}$ at the time of the nth rising edge of $clk_{FDC}$.

y[n] is equivalent to the result of counting DMRO cycles with an infinite-range counter (i.e., a counter than never rolls over), sampling the counter on each rising edge of $clk_{FDC}$, and subtracting M times n from the result, where n= 1, 2, 3, . . . . This is illustrated in FIG. 4 for M=60 along with a corresponding timing diagram. The counter increases with a slope that is low when the DMRO frequency is $f_{low}$ and a slope that is higher when the DMRO frequency is $f_{high}$.

Therefore, the counter output is equivalent to the quantized integral of a constant plus the PFD output, u(t), as illustrated in FIG. 4.

With reference again to FIG. 1, the ΔΣ FDC 102 has local feedback through the divider 120, because the divider modulus is N−2y[n]+y[n−1]. For example, increasing the u(t) pulse width during the nth clk$_{FDC}$ period has the effect of increasing y[n] (as can be seen from the timing diagram in FIG. 4), which decreases the divider modulus, which decreases the u(t) pulse width during the (n+1)th clk$_{FDC}$ period. This negative feedback ensures that u(t) has one pulse per clk$_{FDC}$ period (with an average duration that is a function of M, f$_{low}$, and f$_{high}$), so each rising edge of the reference is always followed by a rising edge of the divider output. This implies that the average frequency of the divider output is f$_{ref}$, so the average value of v[n], and, hence, y[n], must be −α when the PLL output frequency is (N+α)f$_{ref}$. The average frequency of the DMRO 112 locks to Mf$_{ref}$ as a byproduct of the ΔΣ FDC's 102 operation, which minimizes the potential for fractional spurs.

Figures 5A, 5B:
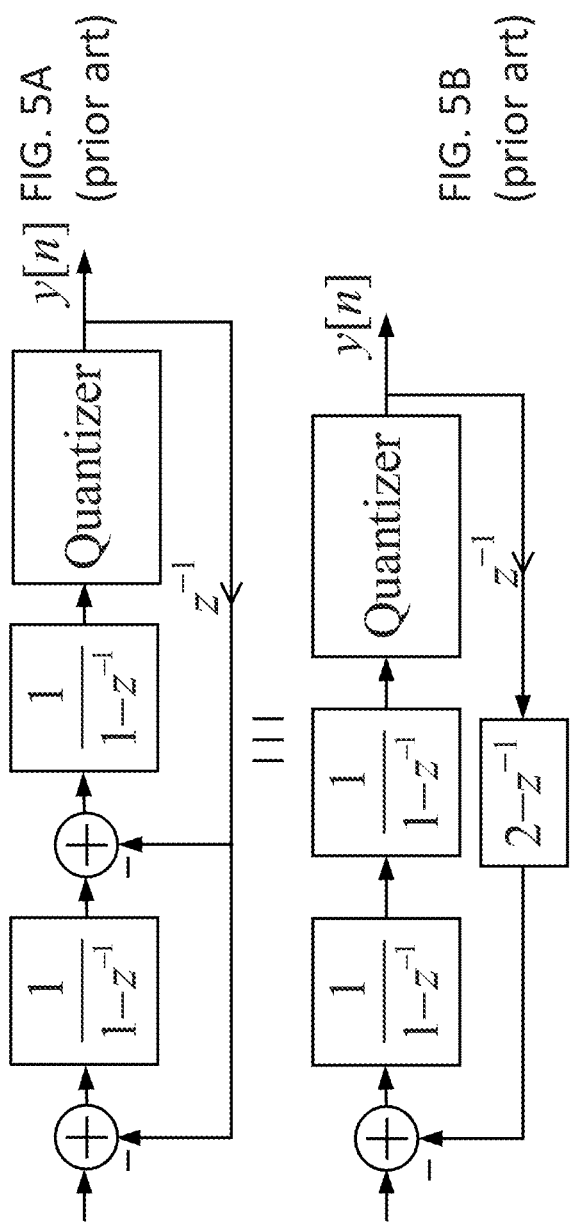
FIGS. 5A (prior art) and 5B (prior art) are block diagrams showing equivalent forms of a second order ΔΣ modulator.

FIG. 5A represents the well-known second-order ΔΣ modulator. The ΔΣ FDC equivalence to a ΔΣ modulator can be seen from the bottom ΔΣ modulator FIG. 5B. The 2−z$^{−1}$ block of the ΔΣ modulator is implemented by the 2−z$^{−1}$ block in the ΔΣ FDC. The second accumulator and quantizer are implemented by the integration and quantization performed by the DMRO and ring phase calculator in the FIG. 1 embodiment. The divider's output frequency varies in proportion to both v[n] and the PLL's frequency error, i.e., its deviation from (N+α)f$_{ref}$, so the divider's output phase and, consequently, the width of the u(t) pulse during the nth clk$_{FDC}$ period is proportional to the integral of both v[n] and the PLL's frequency error. This integration operation implements the first accumulator in the ΔΣ modulator.

A significant aspect of the above-mentioned ΔΣ modulator equivalence is that the ΔΣ FDC inherits the self-dithering property of a second-order ΔΣ modulator, which suppresses spurious tones that would otherwise occur in its quantization noise. In contrast, previously published gated ring oscillator (GRO) and switched ring oscillator (SRO) time-to-digital converters (TDCs) and previously-published first-order FDCs that have been used in PLLs are only equivalent to first-order ΔΣ modulators, which are notorious for having quantization noise with large spurious tones.

Preferred embodiments will be discussed along with a discussion of an example fabricated integrated circuit (IC) chip and testing of the fabricated IC chip. Artisans will recognize broader aspects of the invention from the discussion of the example IC.

Figure 6:
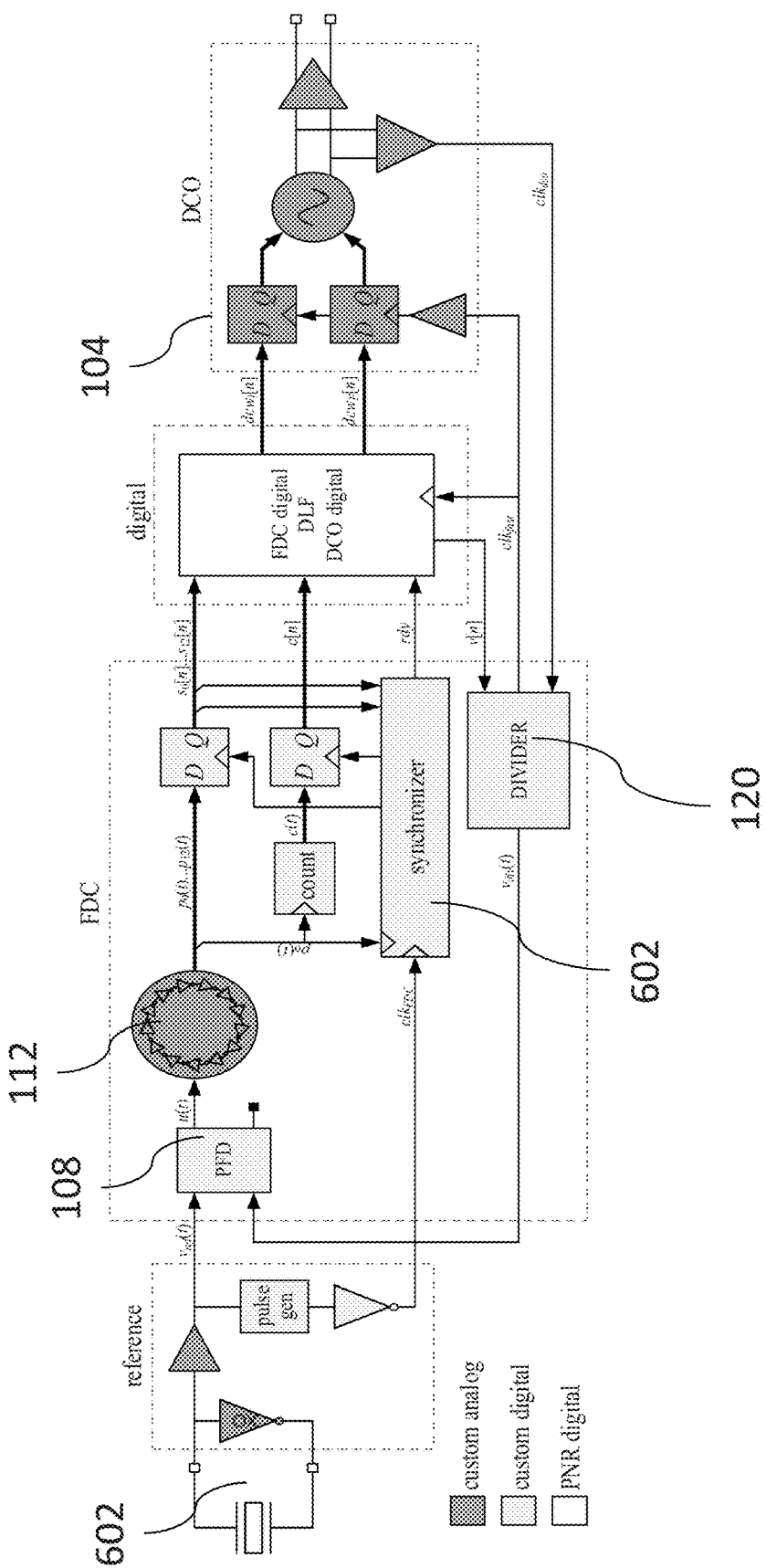
FIG. 6 a block diagram of a preferred embodiment of the FDC-PLL of invention.

FIG. 6 shows a diagram of the fabricated FDC-PLL without its test logic or programming interface. The only blocks which are fully custom analog are reference generation circuitry connected to the crystal oscillator 602, the DMRO 112, and the DCO. The custom digital blocks in the IC are comprised entirely of standard cells, but manually laid out. Manual versus automated layout gives better control over parasitics for improved speed and matching. The ring phase calculator 113, the 2−z$^{−1}$ function 114, the DLF 106, and a portion of the DCO's control logic are all contained in the place and route (PNR) digital.

ΔΣ FDC Timing

Figure 7:
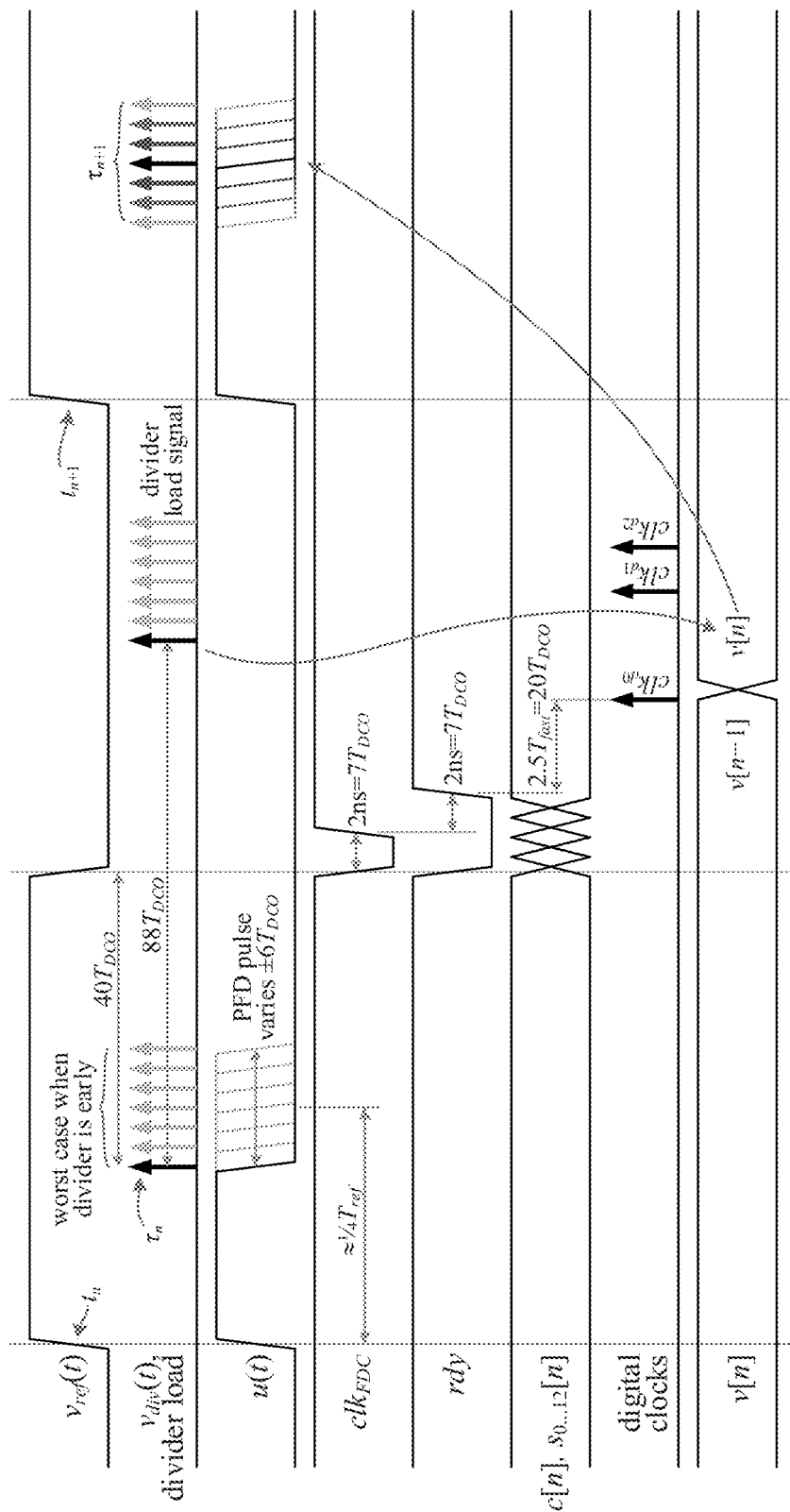
FIG. 7 is a timing diagram of a preferred embodiment FDC-PLL.

FIG. 7 shows a timing diagram for the FIG. 6 IC. The ΔΣ FDC requires the divider 120 to behave as a non-delaying accumulator, so within one period of clk$_{FDC}$ the u(t) pulse must rise and fall, the DMRO 112 must be sampled, and y[n] and v[n] must be computed, all in time for the divider to be loaded for the next period. The DMRO's phase is sampled at the reference frequency, and while it is functionally possible to sample the DMRO on the rising reference edge while u(t) is high and the DMRO frequency is f$_{high}$, it is much simpler timing-wise to sample on the falling reference edge when u(t) is low and the DMRO's frequency is f$_{low}$. As shown in FIG. 7, clk$_{FDC}$ is generated from delayed inverted reference edges; the delay and high duty cycle are only used to save power in the synchronizer 604. The ΔΣ FDC is not sensitive to jitter on this sampling edge because this noise is added after the second accumulator in the equivalent ΔΣ modulator, making it subject to highpass noise shaping just like quantization noise.

The timing bottleneck in this system is generating v[n] in time to affect the divider's next output edge. The value M is preferably chosen (based on f$_{high}$ and f$_{low}$) such that the average width of u(t) is ¼T$_{ref}$. When f$_{ref}$=26 MHz and f$_{pll}$=3.5 GHz, ¼T$_{ref}$=34T$_{DCO}$. It follows from the ΔΣ modulator equivalence that y[n]≤2, so passing y[n] through the 2−z$^{−1}$ block ensures |v[n]|≤6. Thus, each u(t) pulse is high for 28 to 40 DCO periods after the rising reference edge. If u(t) is 28 DCO periods wide, then there are 40 DCO periods between v$_{div}$(t) and the falling edge of v$_{ref}$(t). Adding 2 ns for the clk$_{FDC}$ delay, plus a worst case of 2 ns through the synchronizer means the data into the FDC digital is ready no later than 54 DCO periods into the current divider interval.

Figure 8:
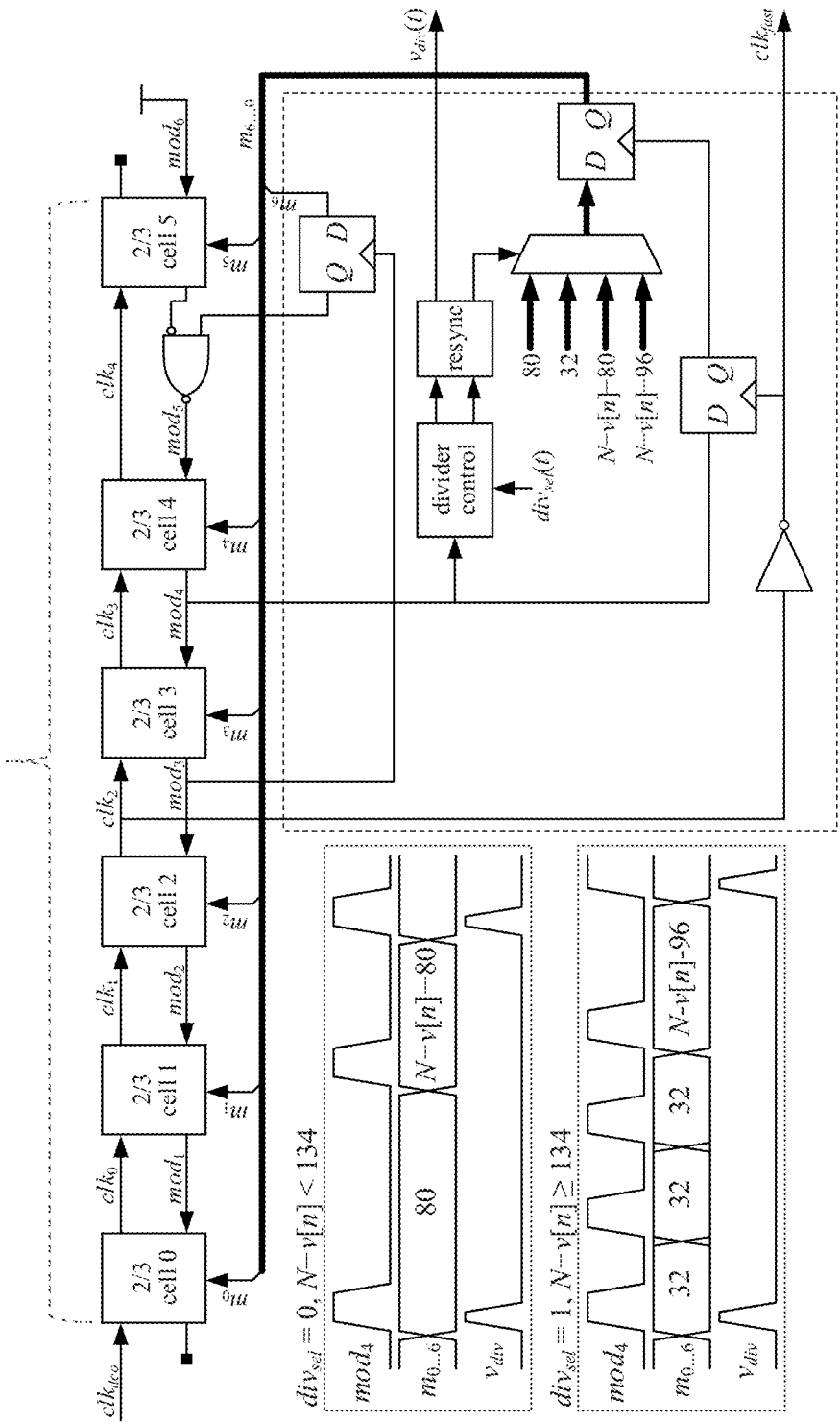
FIG. 8 illustrates a multi-modulus divider applicable to the preferred embodiment FDC-PLLs.

FIG. 8 illustrates details of the divider 120. Rather than dividing by N−v[n] with one chain of divide-by-⅔ cells, the modulus is split into fixed and variable count intervals such that the modulus for the variable count interval need not be loaded until 8 DCO periods before the end of the prior fixed count interval. The divider has a 6-cell ⅔ chain 802 and control logic 804 that re-uses the chain multiple times per division interval. When div$_{sel}$=0, the divider begins each period by dividing by 80. At the end of this interval the chain is re-loaded with the modulus N−v[n]−80, which completes the division. In this mode the divider can accommodate any modulus from 96 through 133. When div$_{sel}$=1, the divider divides by 32 three times for a total of 96, followed by the variable modulus division of N−v[n]−96. In this mode the divider can accommodate any modulus from 134 to 159. In the FDC-PLL timing example in FIG. 8, div$_{sel}$=1 so the divider must be loaded before the 96$^{th}$−8=88$^{th}$ DCO period into its interval. The FDC digital (comprised of the ring phase calculator and 2−z$^{−1}$ block) has 88−54=34 DCO periods to process the current DMRO sample and generate v[n].

Digital Timing

Figure 9:
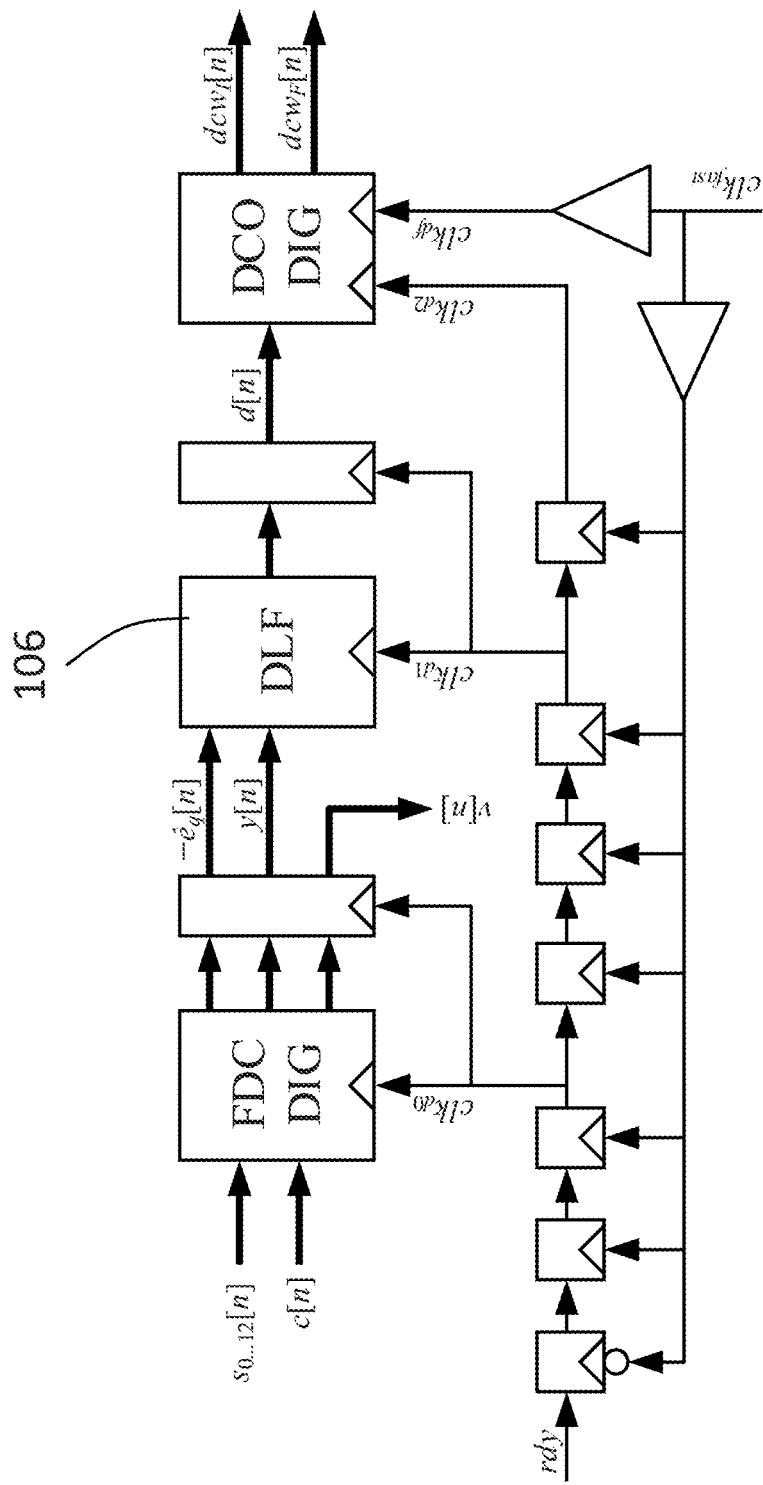
FIG. 9 is a block diagram of a place and route (PNR) digital control logic that provides control logic for the digitally controlled oscillator (DCO) in preferred embodiment FDC-PLLs.

A detailed diagram of the PNR digital is shown in FIG. 9. FDC DIG denotes FDC digital, and DCO DIG denotes DCO digital. Its clock, clk$_{fast}$, is generated by the divider's 3$^{rd}$ ⅔-stage output, which has an average frequency of f$_{dco}$/8. The FDC digital, DLF 106, and a portion of the DCO digital are all clocked at the reference rate by gated versions of clk$_{fast}$. The synchronizer generates the signal rdy which indicates that the sampled DMRO outputs and the ring phase calculator's sampled counter output are valid. The rdy signal is retimed in the PNR digital because it is asynchronous with respect to clk$_{fast}$. This introduces a delay of 0.5-1.5 clk$_{fast}$ periods. The output of the FDC digital is ready one clk$_{fast}$ period after that, for a total of 1.5-2.5 clk$_{fast}$ or 12-20 clk$_{DCO}$ periods between synchronizer data to v[n] output. In total, the v[n] output is ready by the 65$^{th}$-74$^{th}$ DCO period, well before the 88$^{th}$ period when the divider is loaded.

As shown in FIGS. 7 and 9, the rdy signal continues to propagate down the register chain, gating the clock to the DLF and slow (i.e. f$_{ref}$-rate) portion of the DCO digital. This sequence completes before the next reference edge so that when u(t) goes high, the majority of the PNR digital has completed switching. This results in a quiet environment for the DMRO, whose supply sensitivity was measured to be ten times higher when its frequency is $f_{high}$ than when its frequency is $f_{low}$.

The DLF's output, d[n], is synchronous with $clk_{fast}$, so upsampling it within the DCO digital does not require resynchronization. The DCO digital outputs are retimed by a set of flip-flops near the DCO's FCE elements that are powered by the DCO's supply. These flip-flops are clocked by a version of $clk_{fast}$ that is passed directly from the divider to the DCO to minimize jitter.

PFD

The ΔΣ FDC's PFD 108 is identical to the tristate PFD commonly used in analog PLLs, except that it is modified so that its output can only be high when $v_{ref}(t)$ is high. This modification forces u(t)=0 in the second half of each reference period, ensuring that the DMRO frequency is $f_{low}$ when the DMRO outputs and ring phase calculator's counter are sampled. As mentioned above, the average width of u(t) is around $\frac{1}{4}T_{ref}$, so this modification has no effect on normal operation.

DMRO

Figure 10:
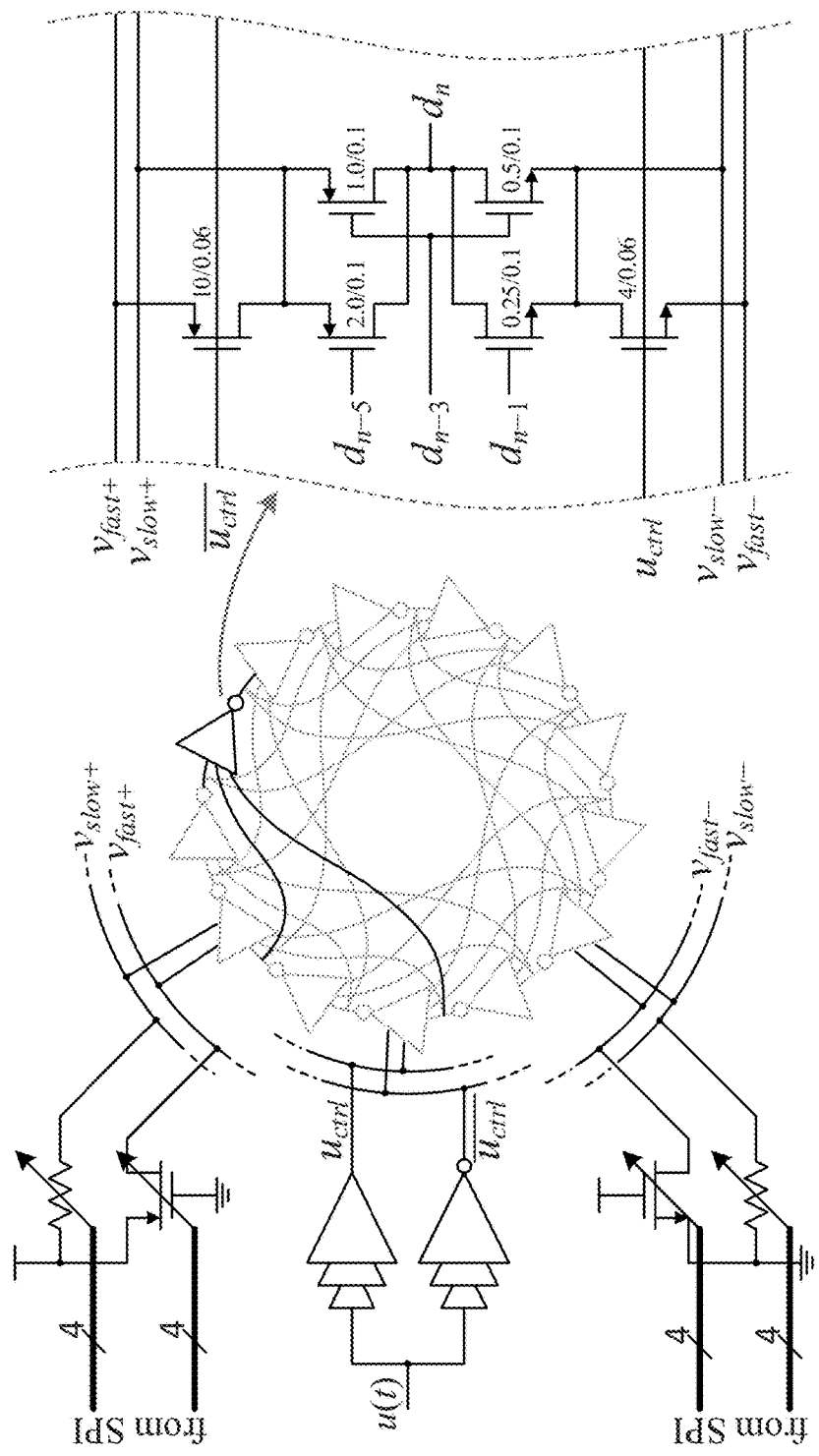
FIG. 10 is a circuit diagram of a preferred embodiment dual-mode ring oscillator (DMRO)

FIG. 10 illustrates the details of the DMRO. It uses multi-path architecture to maximize the number of ring stages under the constraint that $f_{high}-f_{low}=f_{pll}$, because the magnitude of $e_{Rq}[n]$ is inversely proportional to the number of stages. The transistors are sized so that the skip-5 path is dominant, followed by the skip-3 path, followed by the direct path. This effectively shortens the ring to 13/5=2.6 stages, while the other paths have a phase-interpolation effect to ensure that the propagation of edges around the ring is sequential. Without the multi-path architecture, a 13-stage ring in this IC technology would not achieve a high enough frequency to satisfy $f_{high}-f_{low}=f_{pll}$.

DMRO tuning is achieved by current starving the oscillator core. The DMRO's low frequency, $f_{low}$, is tunable from 0.4-3.4 GHz by two SPI-controllable 4-bit resistor arrays, one between VDD and the core, and the other between the core and ground. Its high frequency, $f_{high}$, is controlled in the same way, except transistors in triode are used in place of resistors. Four-bit tuning gives an $f_{high}$ range of 1.8-5.1 GHz. The u(t) signal is buffered and drives switches that connect the MOS array to the core, bypassing the resistor array, so as to modulate the DMRO between $f_{low}$ and $f_{high}$.

A well-known property of charge-pump based analog PLLs is their low sensitivity to non-ideal charge pump switching transients provided that the charge pump current is allowed to fully settle between transient events, and that the rising and falling transient shapes are independent of when the current sources are turned on or off, respectively. For the same reasons, non-ideal DMRO transients between $f_{high}$ and $f_{low}$ do not degrade the FDC-PLL's performance provided the DMRO frequency is allowed to fully settle before u(t) transitions or the DMRO is sampled, and that the rising and falling frequency transient shapes are independent of the times of the rising and falling edges of u(t), respectively. By setting M, $f_{high}$ and $f_{low}$ so that u(t) is on average $\frac{1}{4}T_{ref}$ wide, the settling time for both the rising and falling frequency transients is maximized. Simulations show that the DMRO deviates from its ideal linear behavior by ±0.35%, which results in fractional spurs below 70 dBc.

Ring Phase Calculator Phase Sampling and Synchronizer

Figures 11A, 11B:
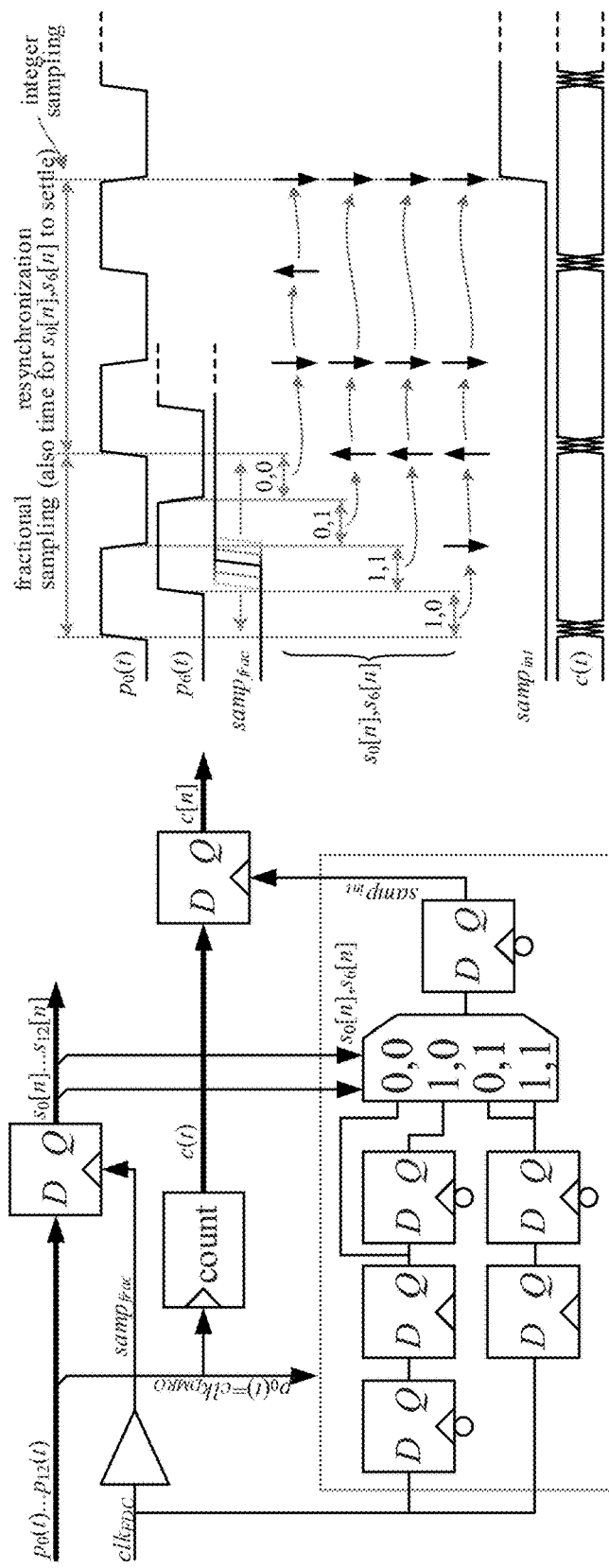
FIGS. 11A and 11B are respectively a block diagram and timing diagram of a DMRO preferred embodiment sampling synchronizer.

FIGS. 11A and 11B respectively show the circuit and timing diagrams of the synchronizer 602. The synchronizer solves two problems which arise from asynchronous sampling of the DMRO by $clk_{FDC}$. The first is that inevitable timing skew between the counter sampler and DMRO sampler will cause glitches near counter increments because the counter will not increment at the exact moment the DMRO phase wraps. The second is that even if the two paths are aligned, if the binary counter is sampled while it is incrementing, hugely incorrect sampled values may result.

The $samp_{frac}$ signal is a buffered version of $clk_{FDC}$ that samples the DMRO's phases $p_0(t)$, $p_1(t)$, . . . , $p_{12}(t)$ to produce $s_0[n]$, . . . , $s_{12}[n]$. Unlike the binary counter, only one of the $p_1(t)$, . . . , $p_{12}(t)$ outputs transitions at a time, and incorrect samples of the actively transitioning output result in a decoded phase that is one $\frac{1}{26}$th of a period (one fractional quantization step) in error. Since the metastable region of the sampling flip-flops is much narrower than a DMRO's stage delay when oscillating at frequency $f_{low}$, incorrect sampling is only likely to occur when the DMRO's phase is near a boundary between quantization levels. This means the actual error due to a possibly incorrect sample is much smaller than a fractional quantization step.

The pair of DMRO phases $p_0(t)$ and $p_6(t)$ are roughly in quadrature, so the pair of samples ($s_0[n]$, $s_6[n]$) determine in which of roughly four equal parts of a $clk_{DMRO}$ period the $samp_{frac}$ rising edge occurs. Two delay lines clocked on $clk_{DMRO}$ sample $clk_{FDC}$, one starting with a rising edge and the other with the falling edge. Based on which of the four $clk_{DMRO}$ period sub-intervals the $samp_{frac}$ rising edge has arrived, the delay line which sampled $clk_{FDC}$ furthest from its rising edge is selected. The delay lines lengths are such that the generated $samp_{int}$ edge is always 1.5 $clk_{DMRO}$ periods after the $clk_{DMRO}$ period in which the $samp_{frac}$ rising edge arrived, allowing the samples $s_0[n]$ and $s_6[n]$ to settle before the MUX decision is required; this adds a constant offset to c[n], which is irrelevant because c[n] is first differenced in the ring phase calculator.

By using ($s_0[n]$, $s_6[n]$) to determine where to sample the counter, the synchronizer is not sensitive to timing skew between $clk_{DMRO}$ and $clk_{FDC}$ up to a quarter of a $clk_{DMRO}$ period, $T_{DMRO}$. For example, if $samp_{frac}$ is delayed relative to $clk_{FDC}$, then if $clk_{FDC}$ lands in the later part of the (0,1) interval, the samples ($s_0[n]$,$s_6[n]$) may be (0,0) rather than (1,0). In this case sampling first with the falling edge rather than the rising edge still gives the correct result, because if the timing skew is less than one quarter of a DMRO period there are no falling $clk_{DMRO}$ edges between $clk_{FDC}$ and $samp_{frac}$. By inserting replica delays and careful layout, $\frac{1}{4}T_{DMRO}$ delay matching is easy to achieve.

Figure 12:
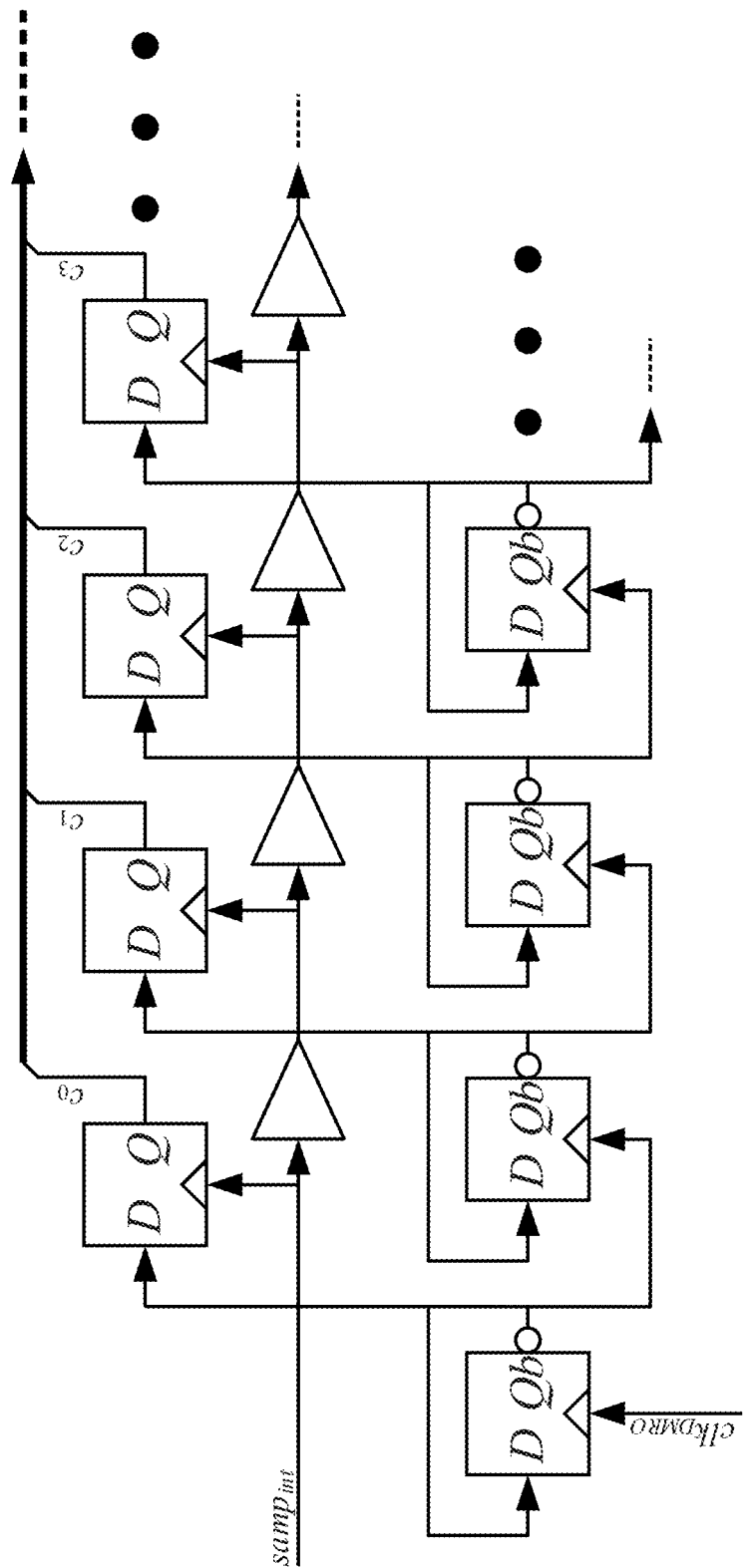
FIG. 12 is a block diagram of a preferred embodiment binary ripple counter and a wave sampling technique.

Retiming $samp_{int}$ to the falling edge of $clk_{DMRO}$ is the first step toward solving the second problem of sampling the binary counter, since the sampling is now synchronous. However this only allows the counter $\frac{1}{2}T_{DMRO}$ to propagate each count. FIG. 12 shows how the binary ripple counter is "wave" sampled sequentially wherein the propagation speed of the wave is designed to approximately equal the propagation speed of the ripple down the counter bits. This reduces the effective propagation delay of the counter to the difference between the total ripple delay and the total wave delay, which can be made quite small by again using matched paths and replica delays in layout.

DCO

Figure 13:
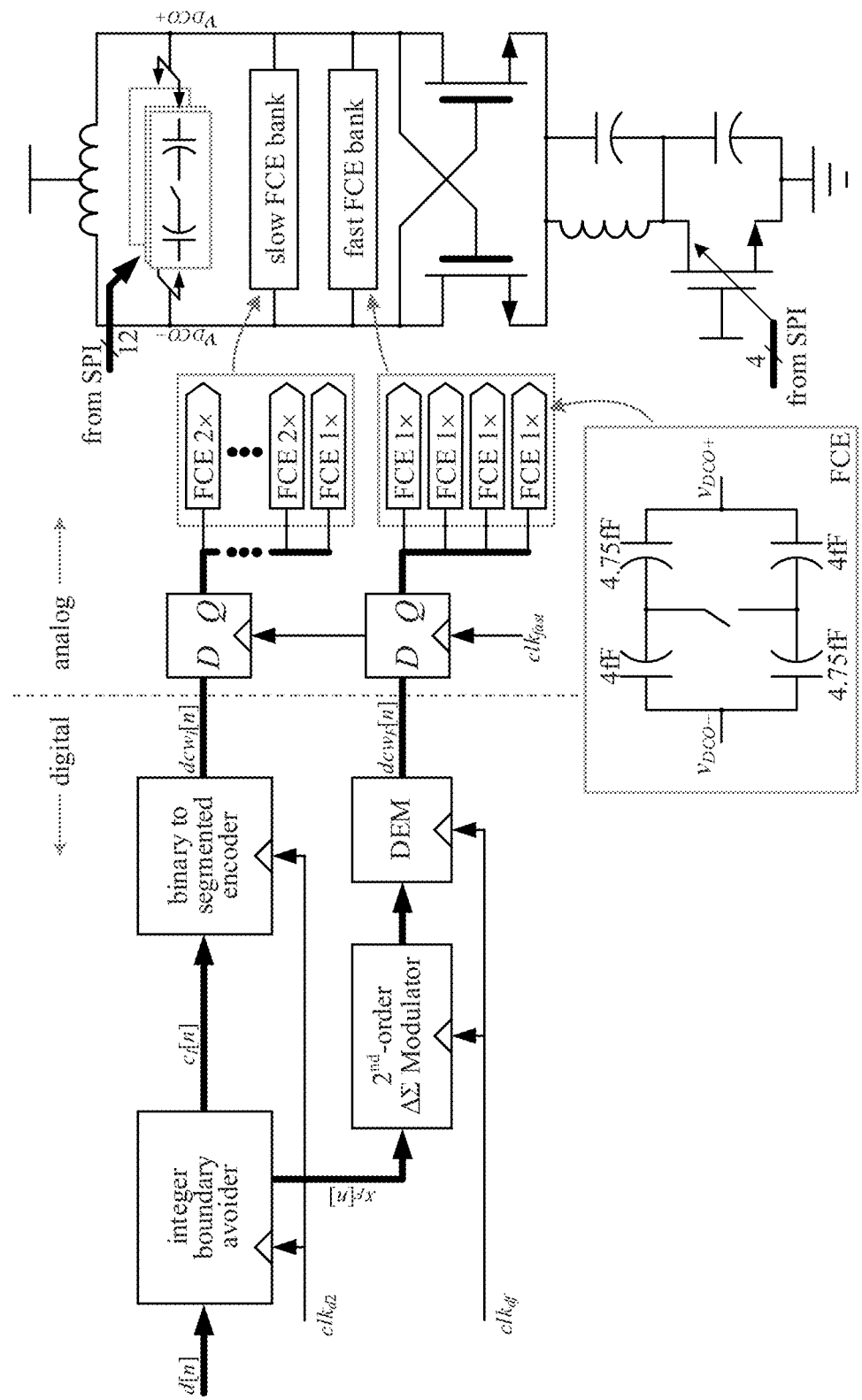
FIG. 13 is a DCO block diagram illustrating the preferred embodiment DCO and its control logic.

FIG. 13 shows the LC-based DCO, which passes the DLF's 14-bit output d[n] through the integer boundary avoider—explained below—which essentially generates $c_I[n]$ from the 6 MSBs of d[n] (integer part) and $x_F[n]$ from the 8 LSBs of d[n] (fractional part). The integer part is encoded to drive the slow frequency control element (FCE) bank, a 2-2-2 . . . 2-1 segmented array of 63 FCEs updated at the reference rate. The FCE creates a capacitance step of 32 aF which is equivalent to a 27 kHz frequency step at 3.5 GHz, giving the slow FCE bank 1.7 MHz of tuning range. The fractional part is upsampled by $clk_{df}$ and requantized by a $2^{nd}$-order digital $\Delta\Sigma$ modulator into a 5-level sequence. This sequence is DEM-randomized to produce $dcw_F[n]$, which drives a fast FCE bank comprised of four FCEs. The LSB of $c_I[n]$ has a frequency weight of one FCE (27 kHz), giving the LSB of d[n] an effective weight of 27 kHz/$2^8$=105 Hz. In parallel with the slow and fast FCE banks is a binary-weighted capacitor array controlled via the SPI interface that has 12 bits of tuning spanning 2.8-3.5 GHz, with a 400 kHz step size at 3.5 GHz. The main inductor is a custom 2-turn 1 nH center-tapped coil, and the regeneration is provided by a cross-coupled thick-oxide NMOS pair with a tail resonant tank and triode-MOS tail source. The inductors, capacitors, and all metal routing were designed and extracted using the EMX 3D field solver.

Integer Boundary Avoider

Figure 14:
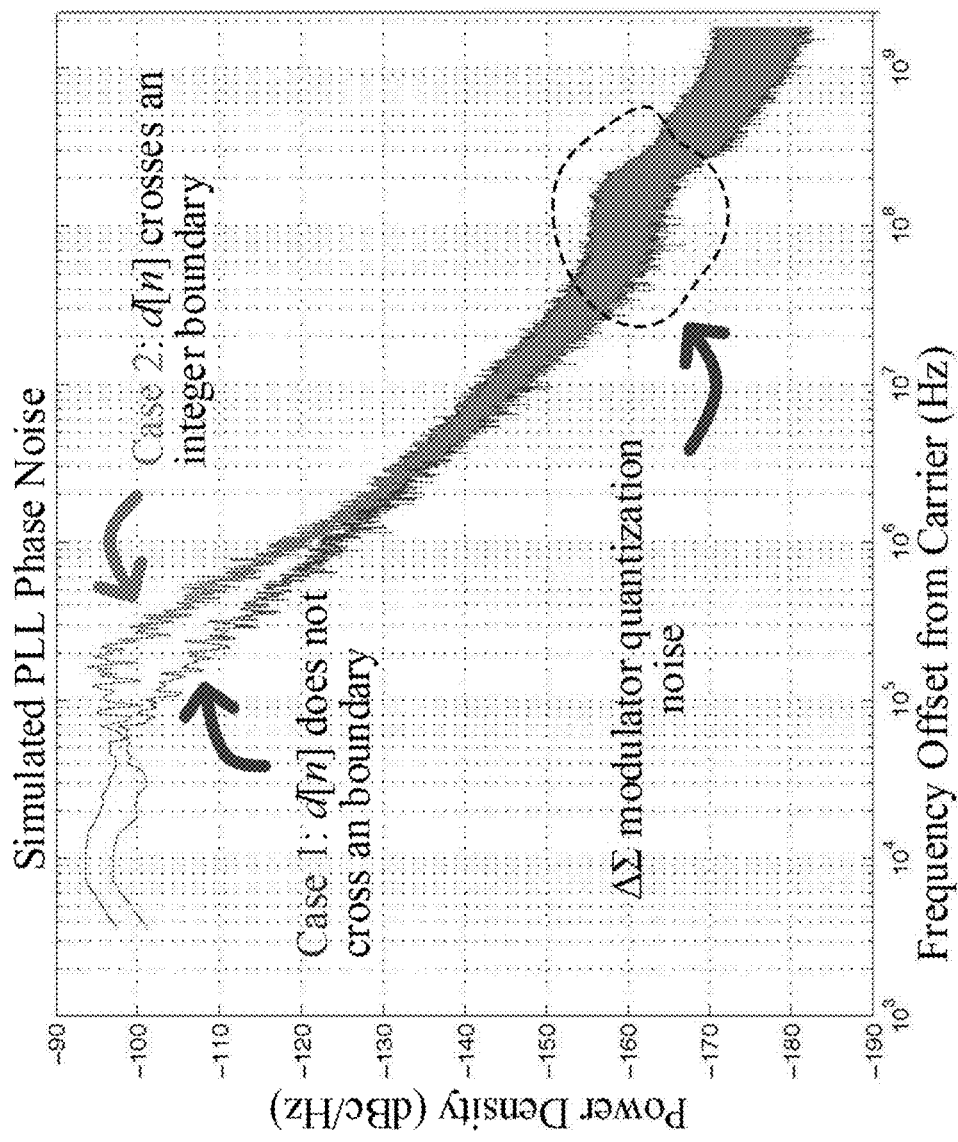
FIG. 14 shows the simulated phase noise of preferred embodiment FDC-PLLs with and without the DCO's integer boundary avoider circuit enabled.

The invention includes an integer boundary avoider. The integer boundary avoider technique presented in FIG. 15 can be applied to any digital PLL that contains a digitally controlled oscillator (DCO), including the preferred embodiment of FIG. 1, but not limited to the present FDC-PLL. When the PLL is locked, any slow variation in the DCO's frequency due to 1/f noise, and supply and temperature changes. will be tracked by the loop and compensated by a restoring change in d[n]. Inevitably d[n] will wander toward an integer boundary i.e. where $x_F[n]$ wraps from 0.111 . . . to 0 or vice versa, and $c_I[n]$ increments or decrements correspondingly. When this happens, the wrapping of $x_F[n]$ will impart a frequency change equal to the average frequency step of the four FCEs in the fast bank. Simultaneously, the increment or decrement of the slow bank will impart a frequency change equal to the frequency step of the particular slow element that is switched. Because the LSB resolution of d[n] is 105 Hz, the FCEs in the slow bank must match the average of the FCEs in the fast bank to better than 105 Hz, which is $2^8$ times smaller than the FCE's 27 kHz frequency step. Achieving 8 bits of matching from 32 aF capacitors is impossible, so in practice large frequency glitches are injected each time an integer boundary is crossed. These glitches can create local non-monotonicites at each integer boundary that lead to limit-cycle-like oscillations whenever the boundary is crossed. This oscillation is detrimental to the PLL's phase noise. FIG. 14 shows a simulation of the FDC-PLL that demonstrates the effect it can have on phase noise.

Figure 15:
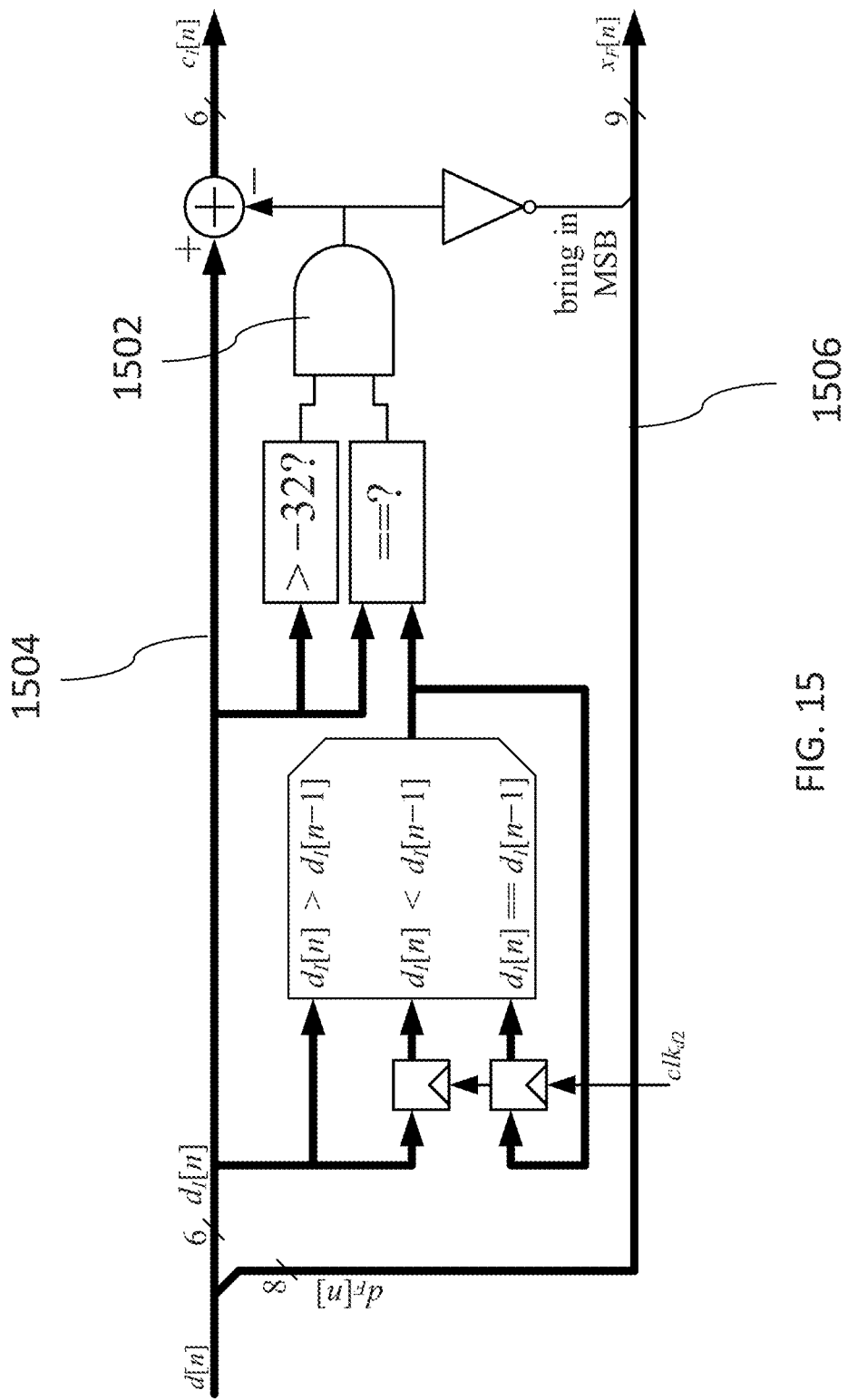
FIG. 15 illustrates integer boundary avoider circuit logic.
Figure 16:
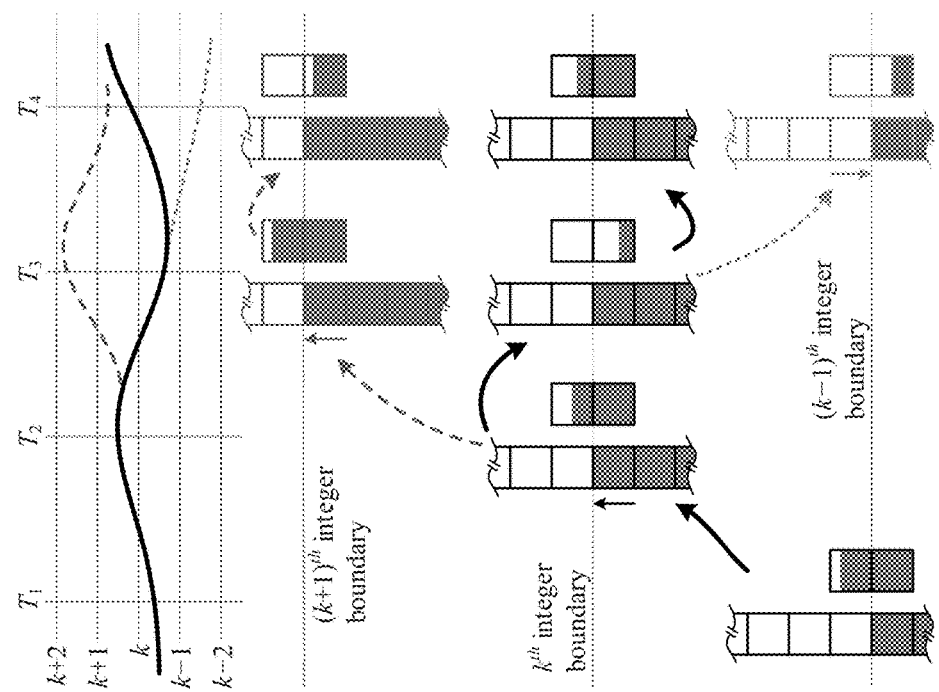
FIG. 16 illustrates an example integer boundary avoider operation.

The integer boundary avoider in FIG. 15 mitigates this problem by minimizing the change of $c_I[n]$ so as to reduce the number of physical integer boundary crossings. As shown, output from the DLF 106 is split into its integer and fractional parts, $d_I[n]$ and $d_F[n]$ such that $d[n]=d_I[n]+2^{-8}d_F[n]$. When an AND gate 1502 output is high, it subtracts one from an integer path 1504, and when it is low, it subtracts $2^8$ from a fractional path 1506; thus the sum $c_F[n]+2^{-8}x_F[n]$ always equals d[n]−1. This doubles the range required of the $\Delta\Sigma$ modulator to [−1,1), which is why the fast FCE bank has 4 rather than 3 FCE elements. Swapping 1 from the integer to the fractional path and vice versa swaps which portion of the $\Delta\Sigma$ modulator's range—either [−1,0) or [0,1)—is used. The logic sets the AND output such that the $\Delta\Sigma$ modulator's "0" point always straddles the previously crossed boundary; in this manner, re-crossings of a just-crossed integer boundary are handled by the $\Delta\Sigma$ modulator's range rather than the integer part. The waveforms in FIG. 16 show the possible scenarios. Starting with the thick trace, when d[n] crosses boundary k in the rising direction at time $T_2$, $c_I[n]$ changes and the slow bank increments; however, subsequent re-crossings of k at times $T_3$ and $T_4$ do not affect $c_I[n]$, because only $x_F[n]$ changes. It is only if d[n] were to cross k+1 (the upper dashed trace) or k−1 (the lower dotted trace) would $c_I[n]$ change, and again in the upper dashed example, when the k+1 is crossed for the second time at $T_4$, $x_F[n]$ is changed instead of $c_I[n]$.

Prototype IC, Power Distribution and Testing

Figure 17:
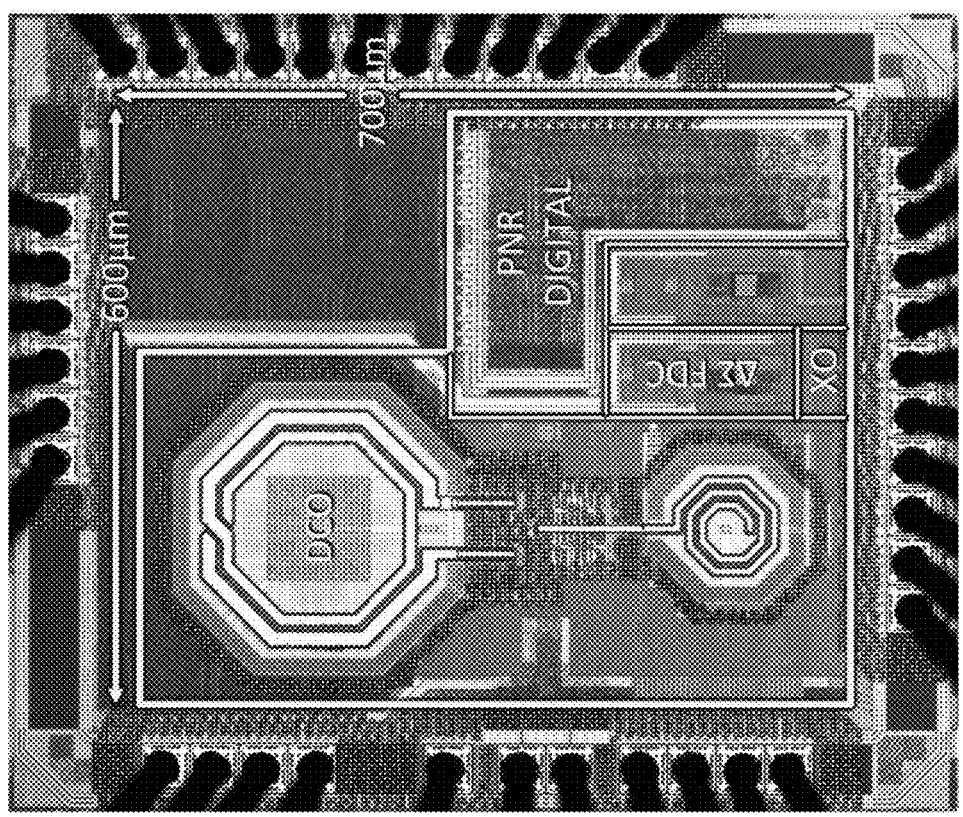
FIG. 17 is a die photograph of an experimental FDC-PLL in accordance with a preferred embodiment FIG. 18 compares characteristics and performance of the experimental FDC-PLL to prior PLLs.

FIG. 17 is an image of a prototype IC of the invention. The separation portions are labelled with the divisions shown in FIG. 6, which include the four separate power domains on the die: reference, FDC, digital, and DCO. The IC has one global ground provided by a low-impedance metal mesh that covers the active layout wherever possible. The use of a single ground simplified block-to-block communication as all signals were passed differentially with a ground shield, minimizing inter-supply current.

The prototype provided a 3.5 GHz digital fractional-N PLL in 65 nm CMOS technology that achieves phase noise and spurious tone performance comparable to those of a high-performance analog PLL. The PLL's largest in-band fractional spur is −60 dBc, its worst-case reference spur is −81 dBc, and its phase noise is −93, −126, and −151 dBc/Hz at offsets of 100 kHz, 1 MHz, and 20 MHz, respectively. Its active area is 0.34 mm² and it dissipates 15.6 mW from a 1 V supply.

Each supply is heavily filtered with passive RC networks occupying any unused layout area, and the FDC supply was further sub-divided into four additional RC-filtered domains: PFD, divider, DMRO, and all the DMRO sampling/synchronization logic. For all the supplies with the exception of the reference, the RC-filter bandwidths were insufficiently low to have an appreciable impact on the fundamental harmonics of their supply currents. However, they were highly effective at minimizing supply bounces due to bondwire ringing from impulsive currents, which would have otherwise coupled back into its own circuitry or inductively to nearby bondwires.

The prototype IC contains the FDC-PLL in FIG. 6 as well as analog and digital test circuitry to measure internal voltages, clocks, and register values. The SPI interface logic and programming registers occupy 20% of the PNR digital area. The IC was fabricated in ST 65 nm single poly, 7 copper CMOS process, and makes use of the dual oxide (LP and GP transistors both available) as well as high-resistivity poly process options. The die which measures 1.0×1.3 mm² is shown in FIG. 17. The active area, which includes inductor density transition regions and all on-chip decoupling capacitance, is 0.34 mm² The area breakdown is given in Table 1.

TABLE 1

| | |
|---|---|
| Total active area (mm²) | 0.34 |
| PNR digital | 0.07 |
| XO and reference buffers | 0.005 |
| DCO and output buffer | 0.21 |
| $\Delta\Sigma$ FDC | 0.02 |
| Decoupling capacitance | 0.035 |

The IC is packaged in a QFN32 package with a ground paddle. Sixteen copies of the IC were tested with a compression socket, of which 4 were damaged by a software bug that caused the IC to briefly receive 5 V during startup. Comprehensive measurements taken on the remaining 12 copies were all consistent. The presented spurious results were measured from one part because it was discovered that soldering the IC to the test board improves its spurious performance by 2-3 dB. This was determined by comparing the before-and-after-soldering measurement data for this particular part. The QFN footprint on the board was tinned rather than leveled and gold plated. It is suspected that unevenness in the tinning caused one or more pads to make poor contact when using the socket, which is corroborated by the fact that over-spec clamp-down pressure was required before the IC even drew current from the supply.

In addition to the IC, the test board contains an Abracon ABM8G 26 MHz crystal for the XO and a TDK HHM1583B1 wideband RF balun to match the differential output buffer to the measurement equipment. Power to the four supply domains is provided by Analog Devices ADP171 voltage regulators with parallel 10 uF X5R and 100 pF NP0 ceramic capacitors. While having independent supplies enabled characterization of individual blocks, for the measurements presented (with the exception of the DCO open loop measurement discussed below) all the IC supply domains were connected together and driven with one regulator. The test board was connected to a motherboard that supplied power and USB communication to the measurement PC.

The phase noise measurements were taken with an Agilent E5052B signal source analyzer, and the spurious tone measurements were taken with an Agilent N9020A spectrum analyzer. In order to prevent unintentional alteration of data, all measurements, data collection, screen captures and plot generation were performed using an automated suite of Python scripts.

The FDC-PLL's phase noise for a 3.5 GHz output with a 400 Hz fractional frequency offset is shown in FIG. 18. As shown, the PLL exceeds GSM phase noise requirements which remain among the most difficult specifications to meet. By running multiple measurements with tweaked PLL configuration parameters, the phase noise contributions of all the individual blocks were extrapolated to produce the plot shown in FIG. 18. It is suspected that an output-power-limiting impedance mismatch limits the phase noise floor, as 20 MHz spot phase noise as low as −154 dBc/Hz has been observed in the lab with a high-quality SMA cable. However for consistency with previously-taken measurements the same generic SMA cable was used for all measurements.

The DCO's true low frequency noise was only visible after a 220 μF electrolytic capacitor was added in parallel with those already attached to the DCO supply regulator. The PLL had sufficiently wide bandwidth to suppress the DCO regulator noise, making the electrolytic capacitor unnecessary.

The reference spur measured was −81 dBc. Due to the asymmetry of the negative and positive offset spurs, it is suspected that the origin of the −81 dBc spur is direct coupling, e.g. through bondwires, not upconversion within the PLL. Repeated sweeps of the spectrum analyzer showed the positive offset spur sometimes disappearing below the noise floor, while the −81 dBc negative-side reference spur remained constant. It is therefore a worst-case bound on reference spur performance. Spectrum analyzer averaging was disabled for this and all spur measurements.

The PLL's fractional frequency offset α was swept from 0 to ½ and the PLL's worst fractional spur for each value of α was determined. For this measurement, the spectrum analyzer's span, sweep time and resolution bandwidth were automatically adjusted for each value of α to ensure the noise floor was low enough to see spurs, and that 5 negative and positive harmonics of $\alpha f_{ref}$ were always visible. The worst fractional spur was always either the first or second, and neither exceeded −60 dBc.

The FDC-PLL's measured performance is summarized in FIG. 18 along with that of the best comparable PLLs published to date. As indicated, the FDC-PLL has excellent phase noise performance with the lowest supply voltage, lowest power dissipation, and best spurious tone performance in its class. Compared to other PLLs with similarly low phase noise, the FDC-PLL achieves an order of magnitude lower spurious tone power than previously reported. The comparisons in FIG. 18 are to:

A—R. B. Staszewski, J. Wallberg, S. Rezeq, C.-M. Hung, O. Eliezer, S. Vemulapalli, C. Fernando, K. Maggio, R. Staszewski, N. Barton, M.-C. Lee, P. Cruise, M. Entezari, K. Muhammad, D. Leipold, "All-Digital PLL and Transmitter for Mobile Phones," *IEEE Journal of Solid-State Circuits*, vol. 40, no. 12, pp. 2469-2482, December, 2005.

B—H. H. Chang, P-Y. Wang, J.-H. C. Zhan, H. Bing-Yu, "A Fractional Spur-Free ADPLL with Loop-Gain Calibration and Phase-Noise Cancellation for GSM/GPRS/EDGE," *IEEE International Solid-State Circuits Conference*, pp. 200-201, 606, February 2008.

C—E. Temporiti, C. Weltin-Wu, D. Baldi, M. Cusmai, and F. Svelto, "A 3.5 GHz Wideband ADPLL With Fractional Spur Suppression Through TDC Dithering and Feedforward Compensation," *IEEE Journal of Solid-State Circuits*, vol. 45, no. 12, pp. 2723-2736, December 2010.

D—L. Vercesi, L. Fanori, F. De Bernardinis, A. Liscidini, and R. Castello, "A Dither-Less All Digital PLL for Cellular Transmitters," *IEEE Journal of Solid-State Circuits*, vol. 47, no. 8, pp. 1908-1920, August 2012.

E—K. Takinami, R. Strandberg, P. C. P. Liang, G. L. G. de Mercey, T. Wong, M. Hassibi, "A rotary-traveling-wave-oscillator-based all-digital PLL with a 32-phase embedded phase-to-digital converter in 65 nm CMOS," *IEEE International Solid-State Circuits Conference*, pp. 100-102, February 2011.

F—Hsu, M. Z. Straayer, M. H. Perrott, "A Low-Noise, Wide-BW 3.6 GHz Digital ΔΣ Fractional-N Frequency Synthesizer with a Noise-Shaping Time-to-Digital Converter and Quantization Noise Cancellation," *IEEE International Solid-State Circuits Conference*, pp. 340-341, February 2008.

Additional Design Considerations for Preferred Embodiments

Figures 19A, 19B:
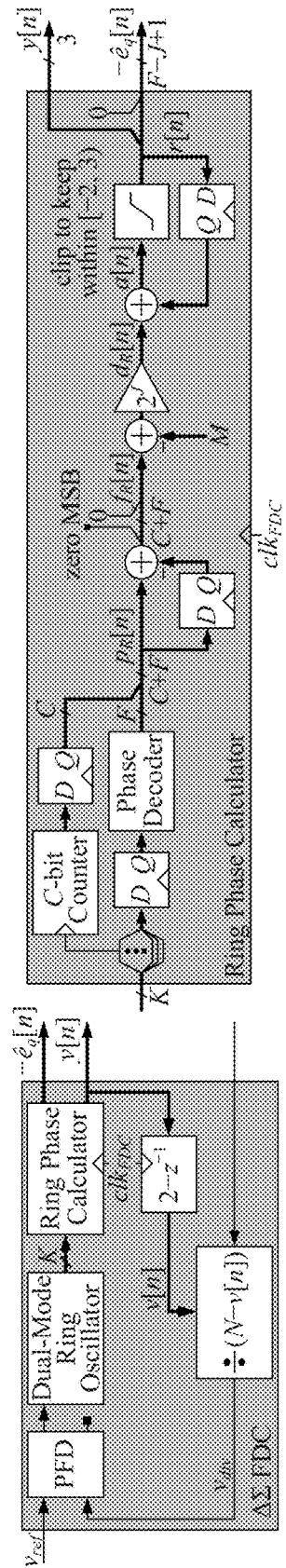
FIGS. 19A and 19B are generalized diagrams to that illustrate preferred signal processing of the ΔΣ FDC and ring phase calculator of FIG. 1.

FIGS. 19A and 19B respectively show generalized versions of the FIG. 1 ΔΣ FDC102 and the FIG. 2 ring phase calculator 113. FIGS. 19A and 19B are labelled with variables that can be used for more generalized designs consistent with the preferred embodiments. The following considerations can aid such designs and provide details about additional preferred embodiments. An analysis of the performance of the FIGS. 19A and 19B embodiment with effects of non-ideal circuit behavior is included in Weltin-Wu, C. et al, "A Linearized Model for the Design of Fractional—N Digital PLLs Based on Dual-Mode Ring Oscillator FDCs," IEEE Transactions on Circuits and Systems, Vol. 62, Issue 8, pages 2013-23 (2015), which is incorporated by reference herein.

DMRO

The DMRO 112 is preferably implemented as a ring of K nominally identical inverters (delay elements). Each inverter has a propagation delay that is one of two values depending on whether the top PFD 108 output, u(t), is high or low. The nominal instantaneous output frequency of the DMRO (neglecting switching transients) is given by:

$$f_{DMRO}(t) = \begin{cases} f_{high}, & \text{if } u(t) = 1, \\ f_{low}, & \text{if } u(t) = 0, \end{cases} \quad (1)$$

where u(t) is the top PFD output, and $f_{high}$ and $f_{low}$ are constants. Ideally, $$f_{high} - f_{low} = 2^{-J} f_{PLL} \quad (2)$$

and $$f_{low} = \frac{M - 2^{-J} f_{PLL} T_{\bar{u}}}{T_{ref}} \quad (3)$$

where $T_{ref}=1/f_{ref}$ is the reference period, J is an integer chosen under the constraint that $2^{1-J}K$ must be integer-valued, M is a positive integer, and $T_{\bar{u}}$ must satisfy $$\frac{4}{f_{PLL}} < T_{\bar{u}} < \frac{T_{ref}}{2} - \frac{4}{f_{PLL}} \quad (4)$$

when the FDC-PLL is locked $T_{\bar{u}}$ is the average PFD 108 pulse width, and the DMRO 112 is locked to an average frequency of $Mf_{ref}$. The integer J is a design parameter that specifies a tradeoff between the DMRO's frequency spread and its contribution to the FDC-PLL's overall phase noise. It is not critical that (2) and (3) be satisfied exactly or that the frequency transitions are instantaneous.

Ring Phase Calculator 114

The input to the ring phase calculator 114 is the DMRO's set of K inverter outputs. The C-bit counter is clocked by one of the DMRO inverter outputs, so the counter increments once per DMRO cycle and rolls over modulo $2^C$. The C counter bits are interpreted as an unsigned number in the range $\{0, 1, 2, \ldots, 2^C-1\}$.

The ring phase calculator's clock signal, $clk_{FDC}$, is an inverted version of the reference, so its period is $T_{ref}$. The number of counter bits is chosen to satisfy:

$$C \geq \log_2\left(\frac{f_{high}}{f_{ref}}\right) \quad (5)$$

This ensures that the counter rolls over no more than one time per $clk_{FDC}$ period. At any given time the C-bit counter output represents the integer part of the DMRO's phase modulo $2^C$. Therefore, the fractional part of the phase goes to zero each time the counter output increments or rolls over.

Both the C-bit counter output and the K DMRO inverter outputs are sampled on each rising edge of $clk_{FDC}$. A phase decoder block that consists of combinatorial logic maps the K sampled inverter outputs to one of 2K possible quantized fractional phase values of the DMRO. Specifically, its nth output sample is the greatest number in the set {0, 1/(2K), 2/(2K), 3/(2K), ..., 1−1/(2K)} that is less than or equal to the fractional part of the DMRO's phase at the time of the nth rising edge of $clk_{FDC}$. Consequently, its output is an unsigned fractional F-bit number. If K is a power of two, then $F=1+\log_2 K$. Otherwise, F must be larger than $1+\log_2 K$ so the phase decoder output represents the set of fractional values with negligible round-off error.

The sequence $p_R[n]$ in FIG. 19B is the sum of the sampled counter output and the fractional phase decoder output. It is interpreted as an unsigned fixed-point sequence with the C sampled counter bits forming its integer part and the F fractional phase decoder bits forming its fractional part. Thus, $p_R[n]$ is a quantized representation of the absolute DMRO phase in cycles measured at the nth rising edge of $clk_{FDC}$ that rolls over modulo $2^C$ cycles.

The portion of the ring phase calculator to the right of $p_R[n]$ performs two's complement arithmetic. The sequence $f_R[n]$ is obtained by performing a two's complement difference of $p_R[n]$ and $p_R[n-1]$, and replacing the MSB with zero. The clipping accumulator operates on $d_R[n]=2^J(f_R[n]-M)$ and generates the output sequence:

$$r[n] = \begin{cases} a[n], & \text{if } -2 \leq a[n] < 3, \\ 3 - 2^{J-1}/K, & \text{if } a[n] \geq 3, \\ -2, & \text{if } a[n] < -2, \end{cases} \quad \text{where} \quad (6)$$

$$a[n] = r[n-1] + d_R[n] \quad (7)$$

The ring phase calculator output, y[n], is an integer-valued two's complement sequence formed from the 3 MSBs of r[n]. The $-\hat{e}_q[n]$ output is a fractional two's complement sequence formed from the F−J LSBs of r[n] with an appended MSB set to 0.

Average DMRO Frequency

If the ΔΣ FDC is locked for all t≥0, then the clipping accumulator does not clip, so the operations shown in FIG. 19B imply that:

$$r[n]=r[n-1]+2^J(f_R[n]-M) \quad (8)$$

An implication of r[n] being bounded is that the average frequency of the DMRO is $Mf_{ref}$. This follows because (8) can only be bounded if the average of $f_R[n]$ is M. As described above, $f_R[n]$ represents the phase change in cycles over the nth $clk_{FDC}$ period (which has a duration of a reference period), so the DMRO must have an average frequency of $Mf_{ref}$.

Effects of Non-Ideal Circuit Behavior

Typically, in frequency synthesizer applications the most troublesome non-ideal fractional-N PLL behavior is the generation of fractional spurious tones in the PLL's output. All fractional-N PLLs perform quantization, which is a highly nonlinear operation, so this is a potential source of fractional spurious tones. In both analog PLLs and second-order FDC-PLLs, the self-dithering property of higher-than-first-order, multi-bit ΔΣ modulation ideally suppresses spurious tones. Non-ideal circuit behavior can degrade the ΔΣ FDC's equivalence to a second-order ΔΣ modulator, which can degrade the self-dithering property. This can be addressed by designs that ensure that the DMRO has time to settle each time it changes frequency.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A digital fractional-N phase locked loop, comprising:
a delta-sigma frequency-to-digital converter including an input to a phase-frequency detector, a dual-mode ring oscillator including a plurality of delay elements and being driven by an output of the phase-frequency detector, a ring phase calculator that samples outputs of the dual-mode ring oscillator to calculate phase of the dual-mode ring oscillator, and a local feedback path through a digital linear filter and a divider to the phase-frequency detector;
a digital loop filter to suppress quantization noise of the delta-sigma frequency-to-digital converter and noise from other circuit blocks; and
a digital controlled oscillator controlled by the output of the digital loop filter to provide the PLL output and feedback to the delta-sigma frequency-to-digital converter, wherein the divider has a modulus that is split into fixed and variable count intervals such that the modulus for the variable count interval need not be loaded until a predetermined number of digitally controlled oscillator periods before the end of a reference period.

2. The digital fractional-N phase locked loop of claim 1, wherein the dual-mode ring oscillator switches between high and low frequency operation in response to high and low output levels of the phase-frequency detector.

3. The digital fractional-N phase locked loop of claim 1, wherein the ring phase calculator samples outputs of the plurality of delay elements to generate a sequence $-\hat{e}_q[n]$ that is a measure of quantization error in the dual-mode ring oscillator and samples the output of an C-bit counter to generate a sequence y[n] that is a measure of the phase of the dual-mode ring oscillator.

4. The digital fractional-N phase locked loop of claim 3, wherein the ring phase calculator measures quantization error to a resolution that is a fraction of a cycle of the dual-mode ring oscillator.

5. The digital fractional-N phase locked loop of claim 3, wherein the ring phase calculator further comprises a synchronizer to sample the output of the C-bit counter synchronously with an output of one of the plurality of delay elements.

6. The digital fractional-N phase locked loop of claim 1, wherein the ring phase calculator comprises a counter that counts dual-mode ring oscillator cycles and rolls over without being reset, a phase decoder to measure the counter's quantization error to a resolution of a fraction of a digital controlled oscillator cycle, and a clipper to reduce the worst-case locking time of the phase locked loop.

7. The digital fractional-N phase locked loop of claim 1, wherein the ring phase calculator generates an output y[n] that is equivalent to a result of counting dual-mode ring oscillator cycles with an infinite-range counter, sampling the counter on each rising edge of a clock, and subtracting M times n from the result, where n=1, 2, 3, . . . .

8. The digital fractional-N phase locked loop of claim 7, wherein M is a positive integer.

9. The digital fractional-N phase locked loop of claim 1, wherein the local feedback path through the divider ensures that a rising edge of a reference applied to the input to the phase-frequency detector is followed by a rising edge of the divider output.

10. The digital fractional-N phase locked loop of claim 1, wherein outputs of the dual-mode ring oscillator are sampled by the ring phase calculator at a frequency of a reference signal applied to the input of the phase-frequency detector.

11. The digital fractional-N phase locked loop of claim 10, wherein the ring phase calculator samples the outputs of the dual-mode ring oscillator on a falling edge of the reference signal applied to the input when a frequency of the dual-mode ring oscillator is low.

12. The digital fractional-N phase locked loop of claim 1, wherein the dual-mode ring oscillator operates at a high frequency in response to a rising edge of a reference signal applied to an input of the phase-frequency detector and operates at a low frequency in response to a rising edge of the divider output signal applied to an input of the phase-frequency detector.

13. The digital fractional-N phase locked loop of claim 1, wherein the phase-frequency detector is configured such that its output is high only when a reference signal applied to one of its inputs is high.

14. The digital fractional-N phase locked loop of claim 1, wherein the digital linear filter comprises a $2-z^{-1}$ digital filter.

* * * * *